(12) United States Patent
Kihara et al.

(10) Patent No.: US 11,367,610 B2
(45) Date of Patent: Jun. 21, 2022

(54) FILM FORMING AND PROCESS CONTAINER CLEANING METHOD

(71) Applicant: TOKYO ELECTRON LIMITED, Tokyo (JP)

(72) Inventors: Yoshihide Kihara, Miyagi (JP); Takahiro Yokoyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 173 days.

(21) Appl. No.: 16/243,218

(22) Filed: Jan. 9, 2019

(65) Prior Publication Data

US 2019/0214246 A1 Jul. 11, 2019

(30) Foreign Application Priority Data

Jan. 10, 2018 (JP) .............................. JP2018-001930

(51) Int. Cl.
*H01L 21/02* (2006.01)
*H01J 37/32* (2006.01)
(Continued)

(52) U.S. Cl.
CPC .... *H01L 21/0228* (2013.01); *C23C 16/45525* (2013.01); *H01J 37/32724* (2013.01);
(Continued)

(58) Field of Classification Search
None
See application file for complete search history.

(56) References Cited

U.S. PATENT DOCUMENTS

| 5,084,125 A * | 1/1992 | Aoi .................... H01J 37/32862 156/345.31 |
| 7,749,914 B2 * | 7/2010 | Honda .............. H01J 37/32688 438/714 |

(Continued)

FOREIGN PATENT DOCUMENTS

| CN | 101147248 A | 3/2008 |
| CN | 101260517 A | 9/2008 |

(Continued)

OTHER PUBLICATIONS

H2NSi. See National Center for Biotechnology Information (2021). PubChem Compound Summary for CID 10290728, Aminosilane. Retrieved Sep. 17, 2021 from https://pubchem.ncbi.nlm.nih.gov/compound/Aminosilane (Year: 2021).*

*Primary Examiner* — Jose I Hernandez-Kenney
(74) *Attorney, Agent, or Firm* — Weihrouch IP

(57) ABSTRACT

A film forming method for forming a film on a pattern and cleaning a space of a processing container configured to perform therein a plasma processing under a reduced pressure environment. The space is provided with a pedestal and an upper electrode configured to supply radio-frequency power. The upper electrode is disposed in the space to face the pedestal. The method includes: placing a substrate having the pattern on the pedestal provided in the space of the processing container configured to perform therein a plasma processing under a reduced pressure environment; adjusting temperature of a main surface of the substrate for each of a plurality of regions on the main surface of the substrate; and after the adjusting with the substrate on the pedestal, repeating an ordered sequence of a first step of forming a deposition film on the pattern of the substrate and on an inner surface of the processing container, wherein the inner surface includes an inner surface of the upper electrode; and a second step of supplying electric power only to
(Continued)

the upper electrode to generate plasma in the space, thereby cleaning the space and the inner surface.

19 Claims, 23 Drawing Sheets

(51) Int. Cl.
| | |
|---|---|
| *C23C 16/455* | (2006.01) |
| *H01L 21/311* | (2006.01) |
| *H01L 21/3213* | (2006.01) |
| *H01L 21/683* | (2006.01) |
| *H01L 21/67* | (2006.01) |

(52) U.S. Cl.
CPC .... *H01J 37/32862* (2013.01); *H01L 21/0206* (2013.01); *H01L 21/0217* (2013.01); *H01L 21/02112* (2013.01); *H01L 21/02164* (2013.01); *H01L 21/02175* (2013.01); *H01L 21/02186* (2013.01); *H01L 21/02205* (2013.01); *H01L 21/02211* (2013.01); *H01L 21/02274* (2013.01); *H01L 21/31116* (2013.01); *H01L 21/31144* (2013.01); *H01L 21/32137* (2013.01); *H01L 21/32139* (2013.01); *H01J 2237/002* (2013.01); *H01J 2237/332* (2013.01); *H01J 2237/334* (2013.01); *H01J 2237/335* (2013.01); *H01L 21/67248* (2013.01); *H01L 21/6831* (2013.01)

(56) References Cited

U.S. PATENT DOCUMENTS

| | | | | |
|---|---|---|---|---|
| 7,952,049 | B2 * | 5/2011 | Tsukamoto | ....... H01L 21/67103 219/121.58 |
| 2004/0222188 | A1 * | 11/2004 | Kim | .................. H01J 37/32862 216/67 |
| 2014/0197135 | A1 * | 7/2014 | Katsunuma | ....... H01J 37/32477 216/67 |
| 2016/0314982 | A1 * | 10/2016 | Kihara | .............. H01L 21/31138 |
| 2017/0098528 | A1 * | 4/2017 | Kihara | ................ H01L 21/0228 |
| 2019/0131141 | A1 * | 5/2019 | Kihara | .............. H01L 21/31138 |

FOREIGN PATENT DOCUMENTS

| | | | | |
|---|---|---|---|---|
| CN | 103928285 | A | 7/2014 | |
| CN | 107026081 | A | 8/2017 | |
| CN | 110004431 | A | 7/2019 | |
| JP | 2008-538127 | A | 10/2008 | |
| JP | 2014-53644 | A | 3/2014 | |
| JP | 2016-72625 | A | 5/2016 | |
| JP | 2016-207915 | A | 12/2016 | |
| JP | 2017-010749 | A | 1/2017 | |
| JP | 2017-011234 | A | 1/2017 | |
| JP | 2017-73535 | A | 4/2017 | |
| JP | 2017-212331 | A | 11/2017 | |
| TW | 201610204 | A | 3/2016 | |
| WO | WO-2017170405 | A1 * | 10/2017 | ......... H01L 21/3065 |
| WO | 2017/204159 | A1 | 11/2017 | |
| WO | WO-2017204159 | A1 * | 11/2017 | ........... H01L 21/324 |

* cited by examiner

FILM FORMING AND PROCESS CONTAINER CLEANING METHOD

CROSS-REFERENCE TO RELATED APPLICATIONS

This application is based on and claims priority from Japanese Patent Application No. 2018-001930, filed on Jan. 10, 2018 with the Japan Patent Office, the disclosures of which are incorporated herein in their entireties by reference.

TECHNICAL FIELD

Embodiments of the present disclosure relate to a film forming method.

BACKGROUND

According to miniaturization associated with high integration of electronic devices, it is required to control a minimum line width (a critical dimension (CD)) with high precision in pattern formation on a substrate. A change in minimum line width in plasma etching may generally be caused by, for example, a change in the states of surfaces of components of a plasma processing apparatus exposed to a processing space where plasma is generated (e.g., the inner wall surface of a processing container for generating plasma and the inner wall surfaces of various pipes). Various technologies have been developed that cope with the state change of the surfaces of the components of such a plasma processing apparatus (see, e.g., Japanese Patent Laid-open Publication Nos. 2016-072625, 2014-053644, and 2017-073535).

SUMMARY

In one aspect, there is provided a film forming method including: placing a substrate having a pattern on a pedestal provided in a space configured to perform therein a plasma processing under a reduced pressure environment, an upper electrode configured to supply radio-frequency power being disposed in the space to face the pedestal; adjusting temperature of a main surface of the substrate for each of a plurality of regions on the main surface of the substrate; and after the adjusting, repeating a sequence including a first step of forming a deposition film on the pattern of the substrate and a second step of supplying electric power only to the upper electrode to generate plasma in the space, thereby cleaning the space.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
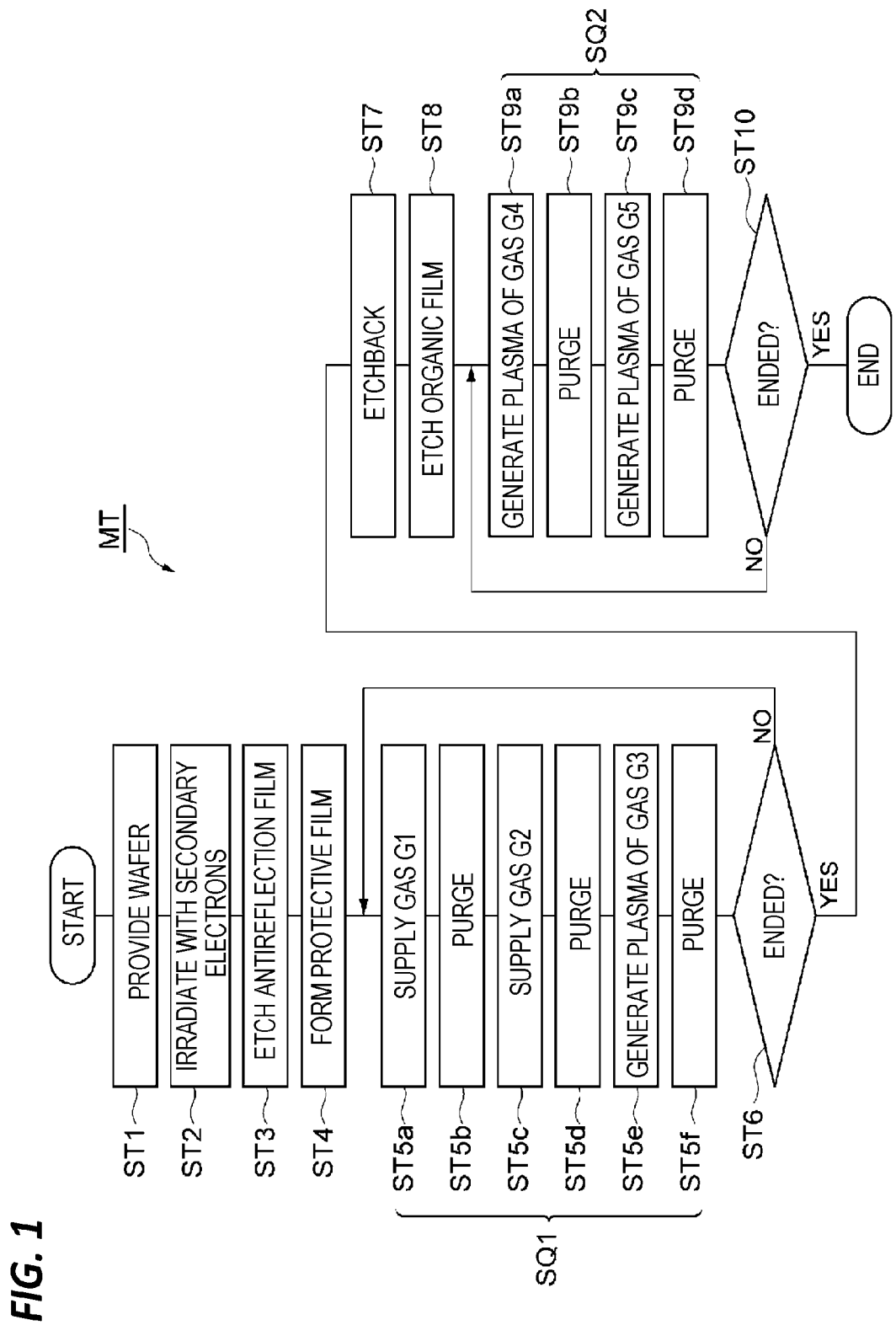
FIG. 1 is a flowchart illustrating a method of processing a substrate to be processed according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a plasma processing, an environment in a processing container (chamber) changes depending on the progress of the plasma processing, and the effect of the plasma processing on a substrate (wafer) may also change due to the change in the environment. For example, when film formation is performed on a substrate, not only a film is formed on the substrate, but also a film may be formed on the inner wall surface of the processing container in some cases. As the film is formed on the inner wall surface of the processing container as the plasma processing for film formation proceeds, the proportion occupied by a portion adsorbed onto the inner wall surface among the gases used for film formation also changes. According to this change, the proportion of a portion of the gases, which is capable of reaching the substrate, may also change. Thus, the formation aspect of a film with respect to the substrate may also change with the progress of the plasma processing. Therefore, what is demanded is a technique capable of uniformizing the formation aspect of a film with respect to a substrate regardless of the degree of progress of a plasma processing that performs film formation.

In one aspect, there is provided a film forming method including: placing a substrate having a pattern on a pedestal provided in a space configured to perform therein a plasma processing under a reduced pressure environment, an upper electrode configured to supply radio-frequency power being disposed in the space to face the pedestal; adjusting temperature of a main surface of the substrate for each of a plurality of regions on the main surface of the substrate; and after the adjusting, repeating a sequence including a first step of forming a deposition film on the pattern of the substrate and a second step of supplying electric power only to the upper electrode to generate plasma in the space, thereby cleaning the space.

The thickness of a film formed on the main surface of a substrate may vary depending on the temperature of the main surface of the substrate. However, in the case where the formation of a deposited film is repeated without cleaning, the degree of change in the film thickness depending on the temperature of the main surface of the substrate decreases while the formation of the deposited film is repeated, whereby the temperature of the main surface of the substrate may not be controlled effectively. On the other hand, in the film forming method described above, formation of a deposited film is performed after the temperature of the main surface of the wafer W is adjusted, but cleaning is also performed whenever the formation of the deposited film is performed. Thus, even if the formation of the deposited film is repeated, the temperature adjustment of the main surface of the wafer W is capable of functioning sufficiently effectively in controlling the thickness of the deposited film on the main surface of the wafer W.

In an embodiment, in the adjusting, the temperature of the main surface is adjusted for each of the plurality of regions using previously acquired corresponding data indicating correspondence between the temperature of the main surface and the film thickness of the deposited film. In this way, since the corresponding data acquired in advance is used, the temperature of the main surface of the substrate is able to be more accurately and reproducibly adjusted.

In an embodiment, the first step includes supplying a first gas including a material of a precursor to the space so as to cause the precursor to be adsorbed to the surface of the pattern, and generating plasma of the second gas so as to supply the plasma to the precursor. In this way, in the first step of forming the deposited film, the deposited film is formed on a surface of the pattern of the substrate first by causing the precursor to be adsorbed to the surface of the pattern of the substrate by the first gas including the material of the precursor, and then supplying plasma of the second gas to the precursor. Therefore, the deposited film may be formed on the surface of the pattern of the substrate by a method which is the same as an atomic layer deposition (ALD) method.

In an embodiment, the first gas is an aminosilane-based gas and the second gas contains oxygen or nitrogen. Further, in the second step, plasma of the third gas is generated in the space, and the third gas contains a halogen compound.

In an embodiment, the first gas aminosilane-based gas includes aminosilane having 1 to 3 silicon atoms. In addition, in an embodiment, the aminosilane-based gas of the first gas may include aminosilane having 1 to 3 amino groups.

In an embodiment, the first gas contains a tungsten halide. In addition, in an embodiment, the first gas contains titanium tetrachloride or tetrakis(dimethylamino)titanium. In addition, in an embodiment, the first gas contains a boron halide.

In an embodiment, the first step (hereinafter, referred to as a "step a") includes supplying a first gas including an electron-donating first substituent (hereinafter, referred to as a "gas a1" when used in step a) so as to cause the first substituent to be adsorbed onto the surface of the pattern and supplying a second gas including an electron-attracting second substituent (hereinafter, referred to as a "gas a2" in the case of being used in step a) to the first substituent. In this way, in the step a of forming the deposited film, by causing the first substituent to be adsorbed onto the surface of the pattern of the substrate by the gas a1 including the electron-donating first substituent, and then generating a polymerization reaction by supplying the gas a2 including an electron-attracting second substituent to the first substituent, it is possible to form a deposited film on the surface of the pattern of the substrate by the polymerization reaction.

In an embodiment, in the above-mentioned step a, a deposited film is formed by the polymerization reaction of isocyanate and amine, or the polymerization reaction of isocyanate and a hydroxyl group-containing compound.

As described above, there is provided a technique capable of uniformizing the formation aspect of a film with respect to a substrate regardless of the degree of progress of a plasma processing that performs film formation.

Hereinafter, various embodiments will be described in detail with reference to the drawings. In each drawing, the same or corresponding components will be denoted by the same symbols. FIG. 1 is a flowchart illustrating a method of processing a substrate (hereinafter, referred to as a "wafer W" in some cases) according to an embodiment. Method MT illustrated in FIG. 1 is an embodiment of a film forming method for forming a film on a substrate. Method MT (the method of processing a substrate) is executed by a plasma processing apparatus 10 illustrated in FIG. 2.

Figure 2:
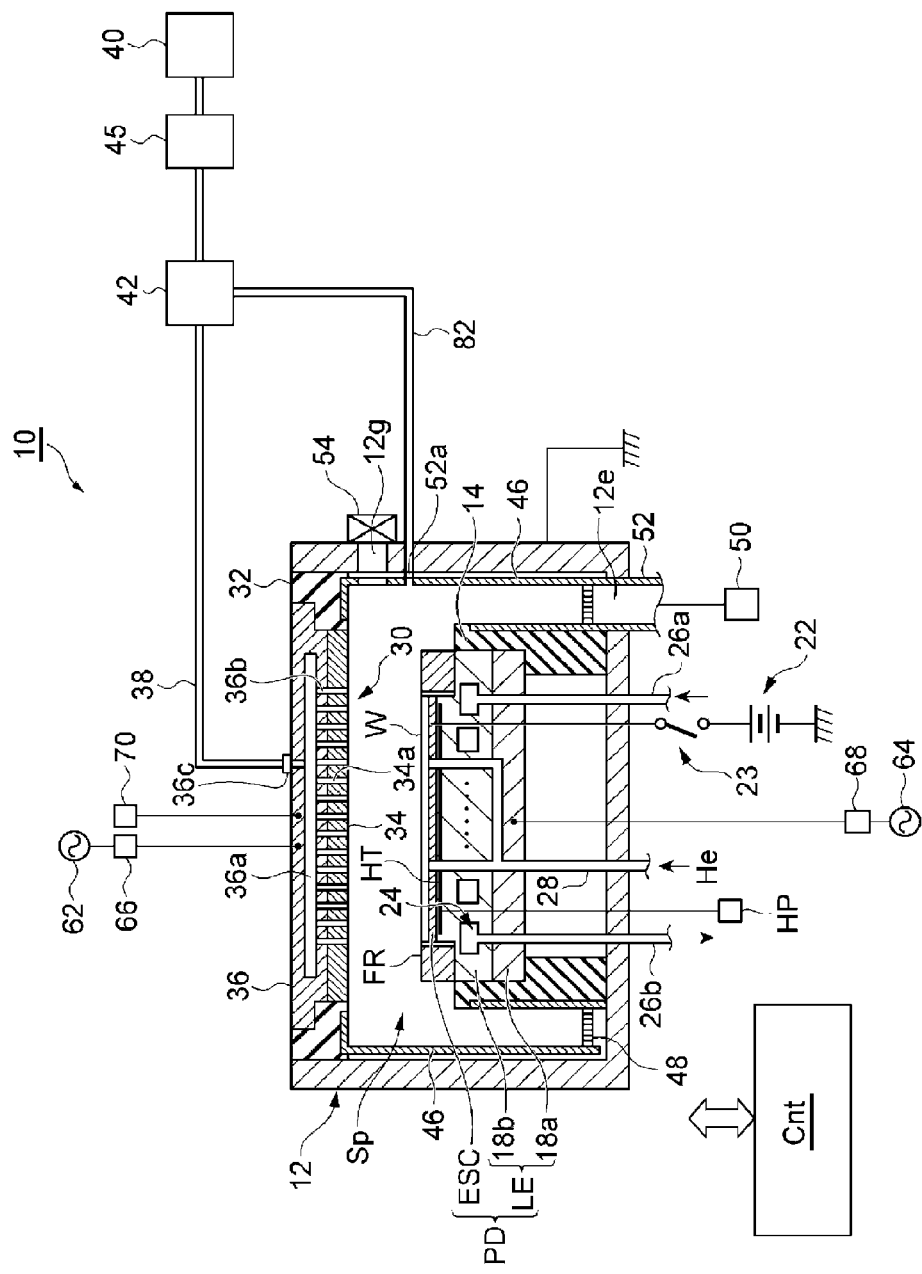
FIG. 2 is a view illustrating an exemplary plasma processing apparatus according to an embodiment, which is used for executing the method illustrated in FIG. 1.

FIG. 2 is a view illustrating an exemplary plasma processing apparatus according to an embodiment, which is used for executing method MT illustrated in FIG. 1. FIG. 2 schematically illustrates a cross-sectional structure of the plasma processing apparatus 10 capable of being used in various embodiments of method MT. As illustrated in FIG. 2, the plasma processing apparatus 10 is a plasma etching apparatus including parallel plate electrodes, and is provided with a processing container 12.

The processing container 12 has, for example, a substantially cylindrical shape and defines a processing space Sp. The processing container 12 has, for example, an aluminum material, and an inner wall surface of the processing container 12 is subjected to an anodic oxidation treatment. The processing container 12 is securely grounded.

On the bottom portion of the processing container 12, for example, a substantially cylindrical support unit 14 is provided. The support unit 14 has, for example, an insulating material. The insulating material of the support unit 14 may contain oxygen like quartz. The support unit 14 extends in a vertical direction from the bottom portion of the processing container 12 in the processing container 12 (in the direction from the bottom portion toward the ceiling side upper electrode 30).

A pedestal PD is provided in the processing container 12. The pedestal PD is supported by the support unit 14. The pedestal PD holds a wafer W on the top surface thereof. The main surface of the wafer W is opposite to the rear surface of the wafer W which is in contact with the top surface of the pedestal PD, and faces the upper electrode 30. The pedestal PD includes a lower electrode LE and an electrostatic chuck ESC. The lower electrode LE includes a first plate 18a and a second plate 18b.

The first plate 18a and the second plate 18b have a metal material such as, for example, aluminum, and have, for example, a substantially disk shape. The second plate 18b is provided on the first plate 18a, and is electrically connected to the first plate 18a.

On the second plate 18b, the electrostatic chuck ESC is provided. The electrostatic chuck ESC has a structure in which an electrode which is a conductive film is disposed between a pair of insulating layers or between a pair of insulating sheets. A direct current (DC) power supply 22 is electrically connected to the electrode of the electrostatic chuck ESC via a switch 23. When the wafer W is placed on the pedestal PD, the wafer W is in contact with the electrostatic chuck ESC.

The rear surface (the surface opposite to the main surface) of the wafer W is in contact with the electrostatic chuck ESC. The electrostatic chuck ESC attracts the wafer W by an electrostatic force such as, for example, a Coulomb force generated by the DC voltage from the DC power supply 22. As a result, the electrostatic chuck ESC is capable of holding the wafer W.

On the peripheral edge portion of the second plate 18b, a focus ring FR is disposed to surround the edge of the wafer W and the electrostatic chuck ESC. The focus ring FR is provided in order to improve the uniformity of etching. The focus ring FR has a material appropriately selected depending on the material of the etching target film, and may have, for example, a quartz material.

The plasma processing apparatus 10 is provided with a temperature adjustment unit HT configured to adjust the temperature of the wafer W. The temperature adjustment unit HT is incorporated in the electrostatic chuck ESC. A heater power supply HP is connected to the temperature adjustment unit HT. As power is supplied from the heater power supply HP to the temperature adjustment unit HT, the temperature of the electrostatic chuck ESC is adjusted, and the temperature of the wafer W placed on the electrostatic chuck ESC is adjusted. Alternatively, the temperature adjustment unit HT may be buried in the second plate 18b.

Figure 3:
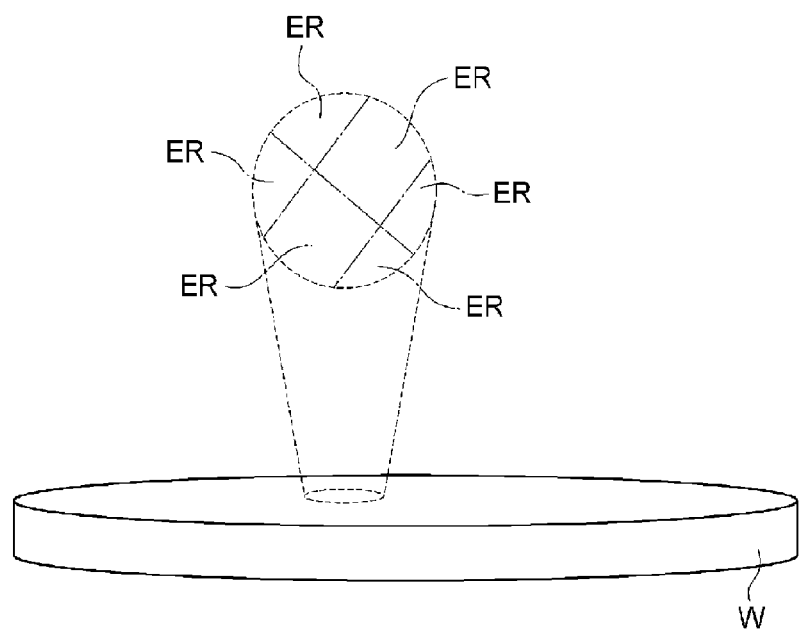
FIG. 3 is a view schematically illustrating some of a plurality of regions on the main surface of a substrate divided in a method of processing the substrate according to an embodiment.

The temperature adjustment unit HT includes a plurality of heating elements that emit heat and a plurality of temperature sensors that detect the ambient temperatures of the plurality of heating elements, respectively. In the case where the wafer W is positioned and placed on the electrostatic chuck ESC, each of the plurality of heating elements is provided for each of a plurality of regions ER on the main surface of the wafer W, as illustrated in FIG. 3. FIG. 3 is a view schematically illustrating some of the plurality of regions ER on the main surface of the wafer W divided by method MT as an example. When the wafer W is positioned and placed on the electrostatic chuck ESC, a controller Cnt described later recognizes the heating elements and temperature sensors, which correspond to respective regions ER on the main surface of the wafer W, in association with the regions. The controller Cnt may identify the heating elements and temperature sensors, which correspond to respective regions ER, based on, for example, numbers such as, for example, numerals or characters for respective regions ER. The controller Cnt detects the temperature of one region ER by a temperature sensor provided in a portion corresponding to the one region ER, and the temperature of the one region ER is adjusted by a heating element provided in the portion corresponding to the one region ER. When the wafer W is placed on the electrostatic chuck ESC, the temperature detected by one temperature sensor is the same as the temperature of the region ER on the temperature sensor in the wafer W.

Inside the second plate 18b, a coolant flow path 24 is provided. The coolant flow path 24 constitutes a temperature adjustment mechanism. A coolant is supplied to the coolant flow path 24 from a chiller unit (not illustrated) provided outside the processing container 12 via a pipe 26a. The coolant supplied to the coolant flow path 24 is returned to the chiller unit via a pipe 26b. In this manner, the coolant is supplied to the coolant flow path 24 in a circulation manner. By controlling the temperature of this coolant, the temperature of the wafer W supported by the electrostatic chuck ESC is capable of being controlled. The plasma processing apparatus 10 is provided with a gas supply line 28. The gas supply line 28 supplies a heat transfer gas such as, for example, He gas, from the heat transfer gas supply mechanism to a space between the top surface of the electrostatic chuck ESC and the rear surface of the wafer W.

The plasma processing apparatus 10 includes an upper electrode 30. The upper electrode 30 is provided on the ceiling side in the processing container 12 (the side opposite to the side where the support unit 14 is provided in the processing container 12). The upper electrode 30 is disposed above the pedestal PD so as to face the pedestal PD.

The lower electrode LE and the upper electrode 30 are installed to be substantially parallel to each other, and form parallel plate electrodes. Between the upper electrode 30 and the lower electrode LE, a processing space Sp is provided in order to perform a plasma processing on the wafer W. The upper electrode 30 is supported in the upper portion of the processing container 12 via an insulative blocking member 32. The insulative blocking member 32 includes an insulating material, and may include oxygen like quartz. The upper electrode 30 may include an electrode plate 34 and an electrode support 36. The electrode plate 34 faces the processing space Sp, and the electrode plate 34 is provided with a plurality of gas ejection ports 34a.

In an embodiment, the electrode plate 34 contains silicon. In another embodiment, the electrode plate 34 may contain silicon oxide ($SiO_2$).

The electrode support 36 detachably supports the electrode plate 34, and may include a conductive material such as, for example, aluminum. The electrode support 36 may have a water-cooling structure. Inside the electrode support 36, a gas diffusion chamber 36a is provided. A plurality of gas flow holes 36b communicating with the gas ejection ports 34a extend downward from the gas diffusion chamber 36a.

The plasma processing apparatus 10 includes a first radio-frequency power supply 62 and a second radio-frequency power supply 64. The first radio-frequency power supply 62 is a power supply configured to generate first radio-frequency power for plasma generation, and generates radio-frequency power of 27 to 100 MHz, for example, 60 MHz in one example. Further, the first radio-frequency power supply 62 has a pulse specification, and is controllable with, for example, a frequency of 0.1 to 50 kHz and a duty of 5 to 100%.

The first radio-frequency power supply 62 is connected to the upper electrode 30 via a matcher 66. The matcher 66 is a circuit configured to match the output impedance of the first radio-frequency power supply 62 with the input impedance on the load side (lower electrode LE side). In addition, the first radio-frequency power supply 62 may be connected to the lower electrode LE via the matcher 66.

The second radio-frequency power supply 64 is a power supply configured to generate second radio-frequency power for drawing ions into the wafer W, that is, radio-frequency bias power, and generates radio-frequency bias power having a frequency in the range of 400 kHz to 40.68 MHz, for example, 13.56 MHz. Further, the second radio-frequency power supply 64 has a pulse specification, and is controllable with, for example, a frequency of 0.1 to 50 kHz and a duty of 5 to 100%.

The second radio-frequency power supply 64 is connected to the lower electrode LE via a matcher 68. The matcher 68 is a circuit configured to match the output impedance of the second radio-frequency power supply 64 with the input impedance on the load side (lower electrode LE side).

The plasma processing apparatus 10 further includes a power supply 70. The power supply 70 is connected to the upper electrode 30. The power supply 70 applies, to the upper electrode 30, a voltage for drawing positive ions existing in the processing space Sp into the electrode plate 34. In one example, the power supply 70 is a DC power supply that generates a negative DC voltage. When such a voltage is applied from the power supply 70 to the upper electrode 30, positive ions existing in the processing space Sp collide with the electrode plate 34. As a result, secondary electrons and/or silicon may be emitted from the electrode plate 34.

On bottom portion side in the processing container 12 (the side opposite to the ceiling side in the processing container 12, and the side where the support unit 14 is provided in the processing container 12) and between the sidewall of the processing container 12 and the support unit 14, an exhaust plate 48 is provided. In the exhaust plate 48, for example, an aluminum material may be coated with ceramics such as Y2O3. An exhaust port 12e is provided below the exhaust plate 48 and in the processing container 12.

An exhaust device 50 is connected to the exhaust port 12e via an exhaust pipe 52. The exhaust device 50 includes a vacuum pump such as, for example, a turbo molecular pump, and is capable of decompressing the processing space Sp of the processing container 12 to a desired degree of vacuum. A carry-in/out port 12g for a wafer W is provided in the sidewall of the processing container 12, and the carry-in/out port 12g is configured to be opened and closed by a gate valve 54.

As will be described later, since the plasma processing apparatus 10 supplies an organic-containing aminosilane-based gas, the plasma processing apparatus 10 includes a pipe that supplies an organic-containing aminosilane-based gas and a post-mix structure configured to separate a pipe that supplies another processing gas (e.g., oxygen gas). Since the organic-containing aminosilane-based gas has a relatively high reactivity, when the supply of the organic-containing aminosilane-based gas and the supply of the other process gas are performed by the same pipe, the components of the organic-containing aminosilane-based gas reacts with the components of the other process gas, and a reaction product resulting from this reaction may deposit in the pipe.

The reaction product which has deposited in the pipe is difficult to remove by, for example, cleaning, and when the cause of particles and the position of the pipe are close to the plasma region, abnormal discharge may be caused. Therefore, it is necessary to supply the organic-containing aminosilane-based gas and the supply of the other process gas with separate pipes, respectively. By the post-mix structure of the plasma processing apparatus 10, the supply of the organic-containing aminosilane-based gas and the supply of the other process gas are performed by separate pipes, respectively.

The post-mix structure of the plasma processing apparatus 10 includes at least two pipes (a gas supply pipe 38 and a gas supply pipe 82). To both the gas supply pipe 38 and the gas supply pipe 82, a gas source group 40 is connected via a valve group 42 and a flow rate controller group 45.

The gas source group 40 includes a plurality of gas sources. The plurality of gas sources may include various gas sources such as, for example, a source of an organic-containing aminosilane-based gas (e.g., a gas included in a gas G1), a fluorocarbon-based gas (CxFy gas (x and y are integers of 1 to 10) (e.g., gases used in steps ST3 and ST7 and a gas included in a gas G2), a source of a gas including oxygen atoms, (e.g., oxygen gas) (e.g., a gas included in the gas G2), a source of a gas including fluorine atoms (e.g., a gas included in a gas G3), a source of a gas including nitrogen atoms (e.g., a gas used in step ST8), a source of a gas including hydrogen atoms (e.g., a gas used in step ST8), and a source of an inert gas such as Ar gas (e.g., a gas included in a gas G5, a purge gas, and a backflow prevention gas).

As the organic-containing aminosilane-based gas, a gas having a molecular structure having a relatively small number of amino groups may be used. For example, a monoamino silane (H3-Si—R (R is an amino group which includes an organic and may be substituted) may be used. The above-described organic-containing aminosilane-based gas (a gas contained in the gas G1 described later) may include an aminosilane having 1 to 3 silicon atoms, or may include an aminosilane having 1 to 3 amino groups.

The aminosilane having 1 to 3 silicon atoms may be a monosilane having 1 to 3 amino groups (monoaminosilane), disilane having 1 to 3 amino groups, or trisilane having 1 to 3 amino groups. In addition, the above-mentioned aminosilane may have an amino group which may be substituted. In addition, the above-mentioned amino groups may be substituted by any of methyl, ethyl, propyl, and butyl groups. Furthermore, the above-mentioned methyl, ethyl, propyl or butyl groups may be substituted by a halogen.

As the fluorocarbon-based gas, any fluorocarbon-based gas such as, for example, CF4 gas, C4F6 gas, or C4F8 gas may be used. As the inert gas, any gas such as, for example, nitrogen gas, Ar gas, or He gas may be used.

The valve group 42 includes a plurality of valves, and the flow rate controller group 45 includes a plurality of flow rate controllers such as mass flow controllers. Each of the plurality of gas sources of the gas source group 40 is connected to the gas supply pipe 38 and the gas supply pipe 82 via a corresponding valve of the valve group 42 and a corresponding flow controller of the flow controller group 45. Accordingly, the plasma processing apparatus 10 is capable of supplying the gases from at least one gas source selected among the plurality of gas sources of the gas source group 40 into the processing space Sp of the processing container 12, at an individually adjusted flow rate.

The processing container 12 is provided with a gas inlet 36c. The gas inlet 36c is provided above the wafer W placed on the pedestal PD in the processing container 12. The gas inlet 36c is connected to one end of the gas supply pipe 38. The other end of the gas supply pipe 38 is connected to the valve group 42.

The gas inlet 36c is provided in the electrode support 36. The gas inlet 36c guides a fluorocarbon gas-based gas, a gas including oxygen atoms, a gas including fluorine atoms, a gas including nitrogen atoms and hydrogen atoms, Ar gas, a purge gas (a gas including, e.g., an inert gas), a backflow prevention gas (a gas including, e.g., an inert gas) into the processing space Sp via the gas diffusion chamber 36a. The above-mentioned various gases supplied from the gas inlet 36c to the processing space Sp via the gas diffusion chamber 36a are supplied to the space region above the wafer W and between the wafer W and the upper electrode 30.

A gas inlet 52a is provided in the processing container 12. The gas inlet 52a is provided on a side of the wafer W placed on the pedestal PD in the processing container 12. The gas inlet 52a is connected to one end of the gas supply pipe 82. The other end of the gas supply pipe 82 is connected to the valve group 42.

The gas inlet 52a is provided in the sidewall of the processing container 12. The gas inlet 52a guides a gas including, for example, an organic-containing aminosilane-based gas, and a backflow prevention gas (a gas including, e.g., an inert gas) into the processing space Sp. The above-mentioned various gases supplied to the processing space Sp from the gas inlet 52a are supplied from the lateral side of the wafer W to the space region on the wafer W and between the wafer W and the upper electrode 30.

The gas supply pipe 38 connected to the gas inlet 36c and the gas supply pipe 82 connected to the gas inlet 52a do not intersect each other. In other words, the gas supply path including the gas inlet 36c and the gas supply pipe 38 and the gas supply path including the gas inlet 52a and the gas supply pipe 82 do not intersect each other.

In the plasma processing apparatus 10, a deposition shield 46 is detachably installed along the inner wall of the processing container 12. The deposition shield 46 is also provided on the outer periphery of the support unit 14. The deposition shield 46 prevents etching by-products (deposits) from adhering to the processing container 12, and in the deposition shield 46, for example, an aluminum may be coated with ceramics such as, for example, Y2O3. In addition to Y2O3, the deposition shield may have a material including oxygen, like, for example, quartz.

The controller Cnt is a computer including, for example, a processor, a storage unit, an input device, and a display device, and controls each unit of the plasma processing apparatus 10 illustrated in FIG. 2. In the plasma processing apparatus 10, the controller Cnt is connected to, for example, the valve group 42, the flow rate controller group 45, the exhaust device 50, the first radio-frequency power supply 62, the matcher 66, the second radio-frequency power supply 64, the matcher 68, the power supply 70, the heater power supply HP, and the chiller unit.

The controller Cnt operates in accordance with a computer program (a program based on an input recipe) for controlling each unit of the plasma processing apparatus 10 in each step of method MT illustrated in FIG. 1, and sends out a control signal. Each unit of the plasma processing apparatus 10 is controlled by the control signal from the controller Cnt.

Specifically, in the plasma processing apparatus 10 illustrated in FIG. 2, the controller Cnt is capable of controlling, for example, the selection and flow rate of a gas supplied from the gas source group 40, the exhaust of the exhaust device 50, the supply of power from the first radio-frequency power supply 62 and the second radio-frequency power supply 64, voltage application from the power supply 70, the supply of power of the heater power supply HP, and the flow rate and temperature of the coolant from the chiller unit.

Each step of method MT for processing a substrate disclosed in this specification may be executed by operating each unit of the plasma processing apparatus 10 by control performed by the controller Cnt. In the storage unit of the controller Cnt, a computer program for executing method MT and various data used for executing method MT are readably stored.

Referring to FIG. 1 again, method MT will be described in detail. Hereinafter, an example in which the plasma processing apparatus 10 is used for executing method MT will be described. In addition, in the following description, reference is made to FIGS. 4A to 4D to FIG. 10 together with FIGS. 1 to 3.

Figure 4A:
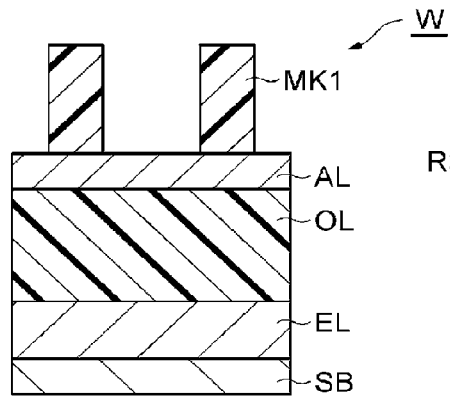
FIGS. 4A to 4D are cross-sectional views illustrating states of a substrate before and after carrying out respective steps illustrated in FIG. 1.
Figure 4D:
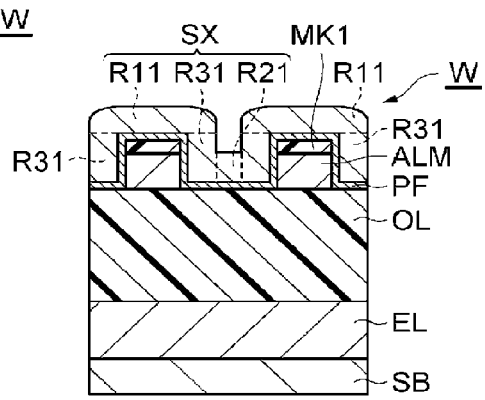
Figure 4B:
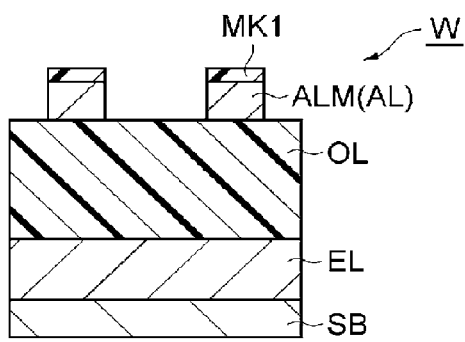
Figure 5A:
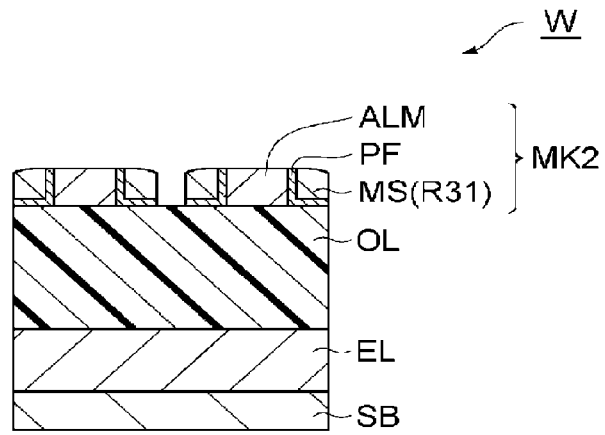
FIGS. 5A to 5C are cross-sectional views illustrating states of a substrate after carrying out respective steps of the method illustrated in FIG. 1.
Figure 5B:
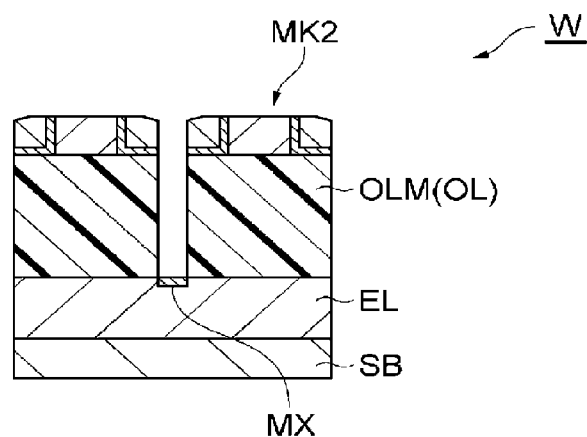
Figure 5C:
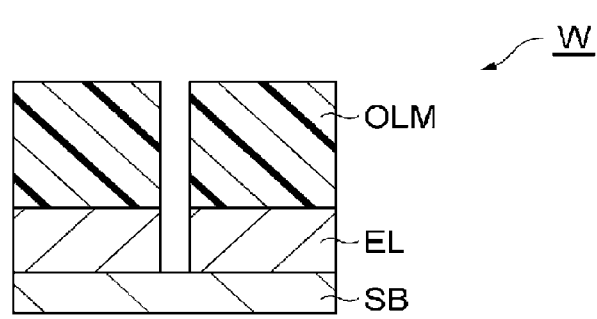
Figure 6:
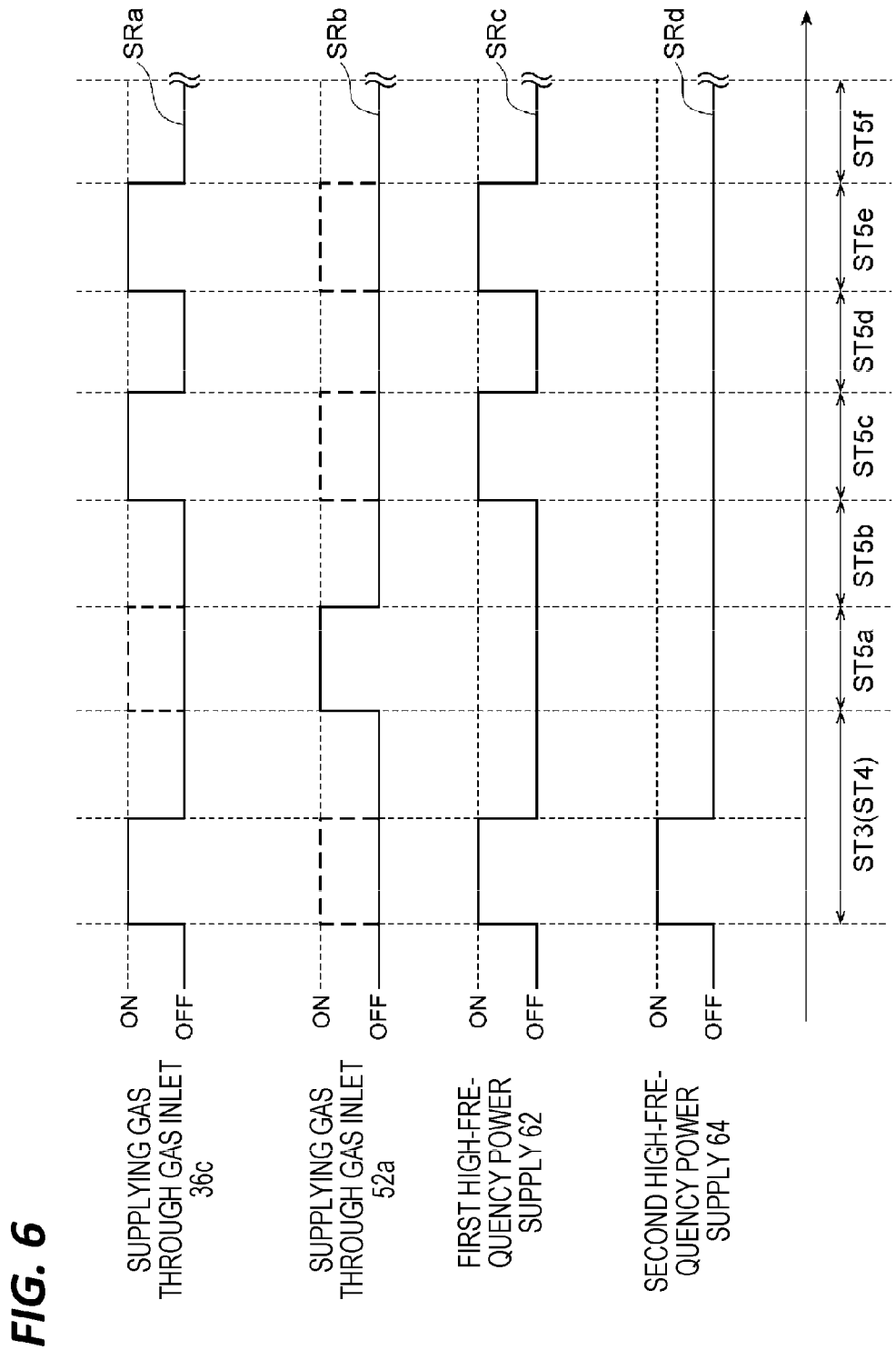
FIG. 6 is a view representing states of supply of a gas and supply of radio-frequency power during execution of respective steps of the method illustrated in FIG. 1.
Figure 7A:
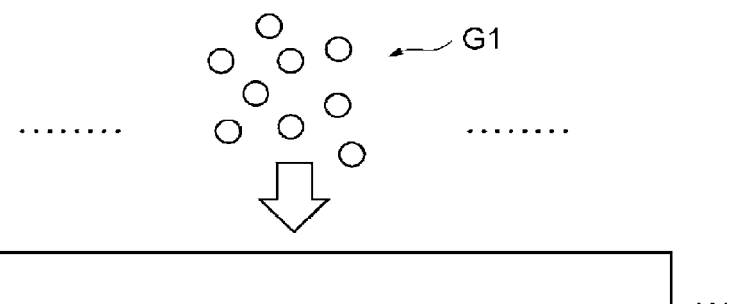
FIGS. 7A to 7C are views schematically illustrating states of forming a protective film in the method illustrated in FIG. 1.
Figure 7B:
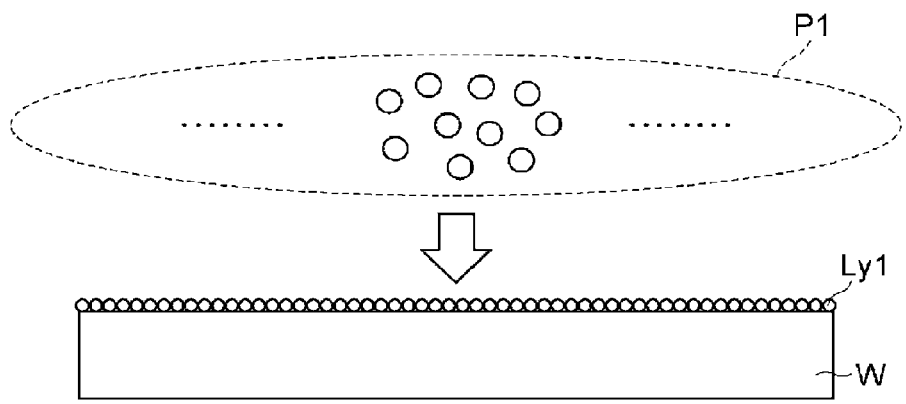
Figure 7C:
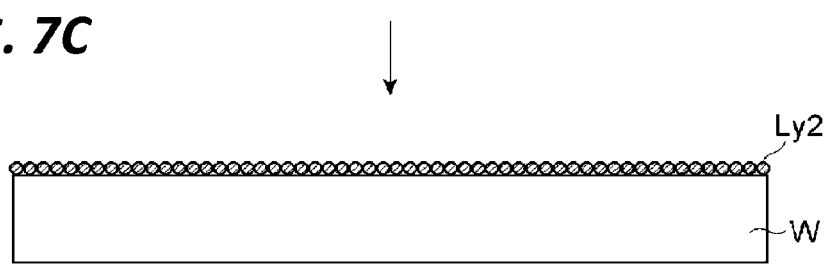
Figure 8:
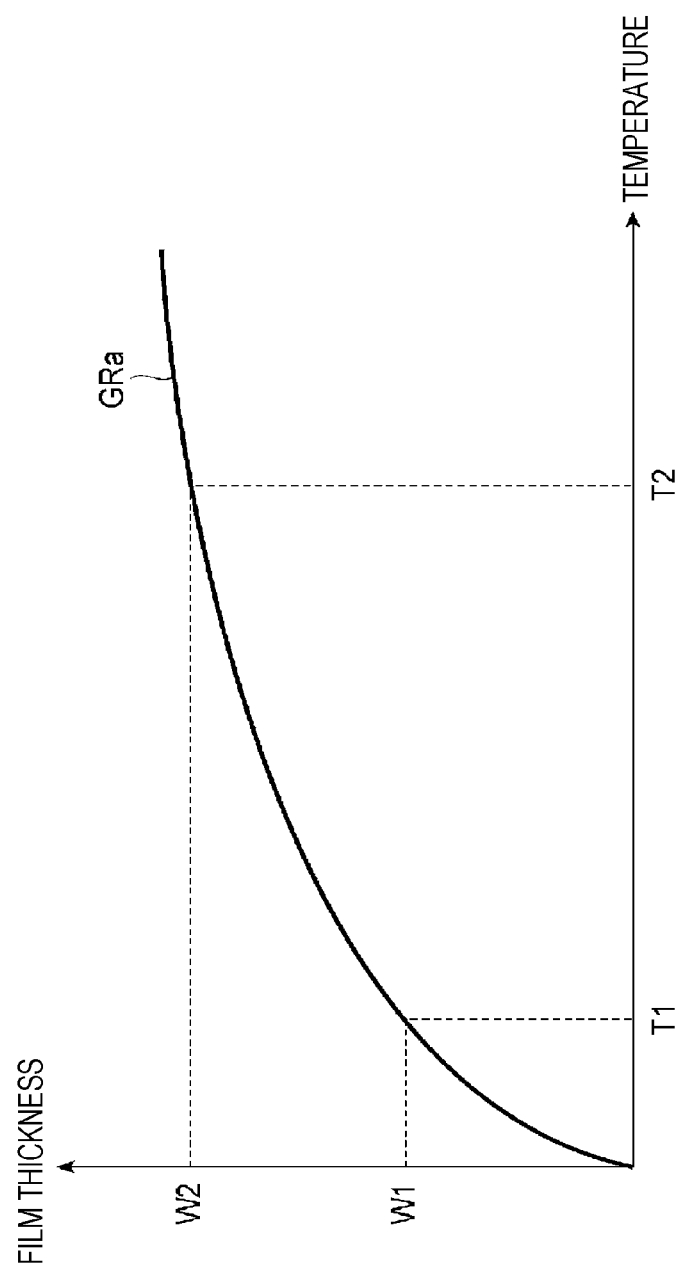
FIG. 8 is a view schematically representing a relationship between a film thickness of a protective film formed by the method illustrated in FIG. 1 and a temperature of the main surface of a substrate.
Figure 9A:
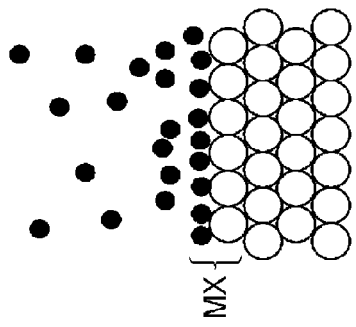
FIGS. 9A to 9C are views illustrating an etching principle of an etching target layer in the method illustrated in FIG. 1.
Figure 9B:
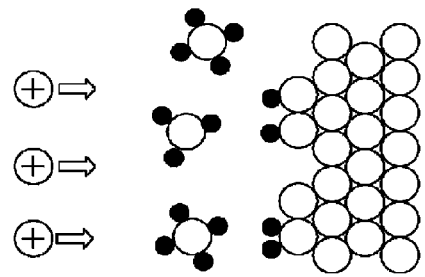
Figure 9C:
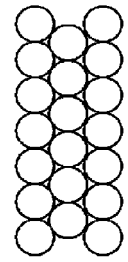
Figure 10:
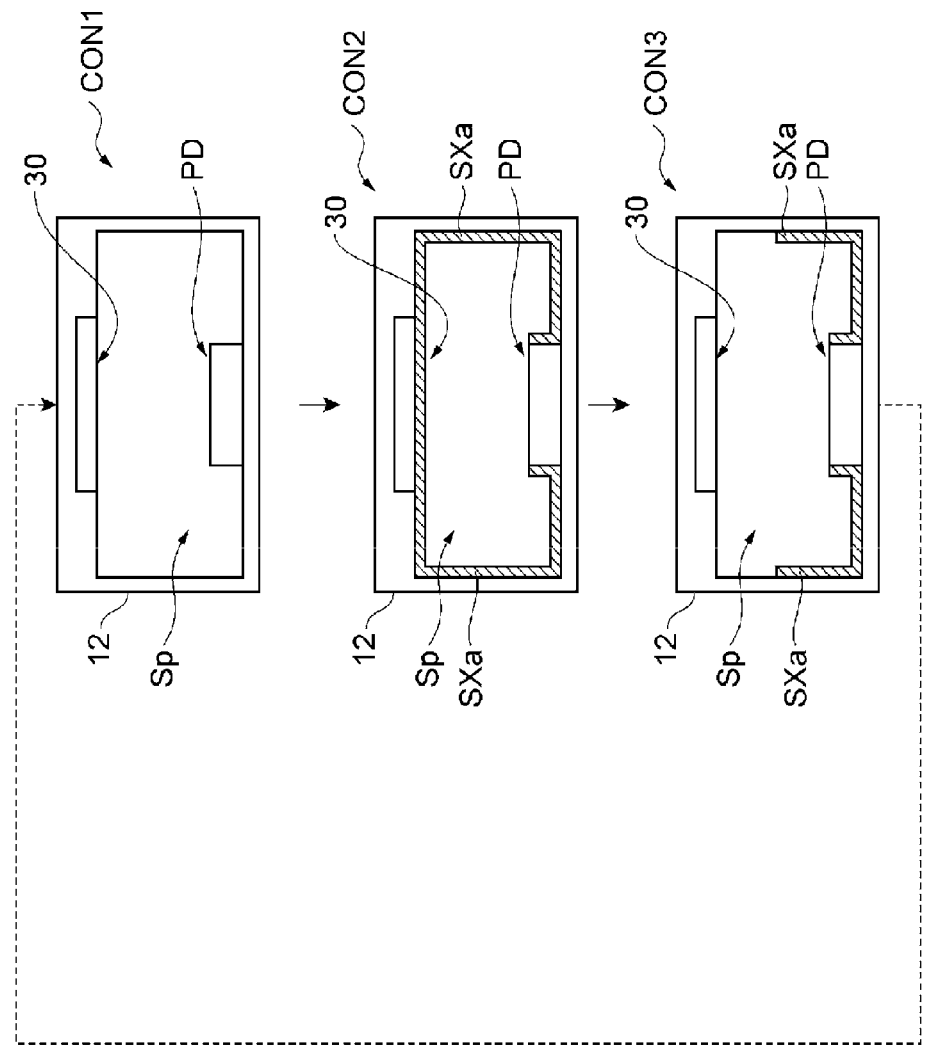
FIG. 10 is a view illustrating a film forming aspect within the processing container illustrated in FIG. 2.

FIGS. 4A to 4D are cross-sectional views illustrating states of a wafer W before and after carrying out respective steps illustrated in FIG. 1. FIGS. 5A to 5C are cross-sectional views illustrating states of a wafer W after carrying out respective steps of the method illustrated in FIG. 1. FIG. 6 is a view representing states of supply of a gas and supply of radio-frequency power during execution of respective steps of method M illustrated in FIG. 1. FIGS. 7A to 7C are views schematically illustrating states of forming a protective film SX in method MT illustrated in FIG. 1. FIG. 8 is a view schematically illustrating a relationship between the film thickness of a protective film SX formed by the film forming process (sequence SQ1 and step ST6) of method MT illustrated in FIG. 1 and the temperature of the main surface of the wafer W. FIGS. 9A to 9C are views illustrating a principle of etching an etching target layer EL in method MT illustrated in FIG. 1. FIG. 10 is a view illustrating a film forming aspect within the processing container 12.

Method MT is a film forming method in which a film is formed on a pattern formed on a wafer W (a pattern defined by unevenness formed on the main surface of the wafer W and defined by, for example, a mask MK1 to be described later). The wafer W is placed on the pedestal PD provided in the processing space Sp in which a plasma processing is capable of being performed under a reduced pressure environment. As described above, in the plasma processing apparatus 10, the upper electrode 30 which faces the pedestal PD and is capable of supplying radio-frequency power is disposed in the processing space Sp. As illustrated in FIG. 1, method MT includes steps ST1 to ST10. Method MT includes a sequence SQ1 (steps ST5a to ST5d in sequence SQ1 are sometimes referred to as a thin film forming step as described later), and a sequence SQ2. First, in step ST1, the wafer W illustrated in FIG. 4A is provided as the wafer W illustrated in FIG. 2. In step ST1, as illustrated in a state CON1 in FIG. 10, the surfaces of all the components of the plasma processing apparatus 10 inside the processing container 12 (e.g., the inner wall surface of the processing container 12 configured to generate plasma (hereinafter, also simply referred to as an inner surface of the processing container 12)) are exposed to the processing space Sp.

As illustrated in FIG. 4A, the wafer W provided in step ST1 includes a substrate SB, an etching target layer EL, an organic film OL, an antireflection film AL, and a mask MK1. The etching target layer EL is provided on the substrate SB. The etching target layer EL is a layer having a material that is selectively etched with respect to the organic film OL, and an insulating film is used therefor. The etching target layer EL may include, for example, silicon oxide. In addition, the etching target layer EL may have other materials such as, for example, polycrystalline silicon, in some cases.

The organic film OL is provided on the etching target layer EL. The organic film OL is a layer including carbon, and is, for example, a spin-on hard mask (SOH) layer. The antireflection film AL is a silicon-containing antireflection film, and is provided on the organic film OL. The mask MK1 is provided on the antireflection film AL. The mask MK1 is a resist mask having a resist material, and is manufactured by patterning a resist layer by a photolithography technique. The mask MK1 partially covers the antireflection film AL. The mask MK1 defines an opening for partially exposing the antireflection film AL. The pattern of the mask MK1 is, for example, a line-and-space pattern. Alternatively, the mask MK1 may have a pattern that provides a circular opening in plan view. Alternatively, the mask MK1 may have a pattern that provides an elliptical opening in plan view.

In step ST1, the wafer W illustrated FIG. 4A is provided, and the wafer W is accommodated in the processing space Sp of the processing container 12 of the plasma processing apparatus 10 and placed on the pedestal PD.

In step ST2 subsequent to step ST1, the wafer W is irradiated with secondary electrons. Specifically, as hydrogen gas and rare gas are supplied into the processing space Sp of the processing container 12 from the gas inlet 36c via the gas supply pipe 38 and radio-frequency power is supplied from the first radio-frequency power supply 62, plasma is generated. Further, a negative DC voltage is applied to the upper electrode 30 by the power supply 70. As a result, positive ions in the processing space Sp are drawn into the upper electrode 30, and the positive ions collide with the upper electrode 30. As the positive ions collide with the upper electrode 30, secondary electrons are released from the upper electrode 30. By irradiating the wafer W with the released secondary electrons, the mask MK1 is modified. When step ST2 is ended, the inside of the processing space Sp of the processing container 12 is purged.

When the level of the absolute value of the negative DC voltage applied to the upper electrode 30 is high, the positive ions collide with the electrode plate 34, whereby silicon which is a constituent material of the electrode plate 34 is released together with secondary electrons. The released silicon is combined with oxygen released from the components of the plasma processing apparatus 10 exposed to the plasma. The oxygen is released from members such as, for example, the support unit 14, the insulative blocking member 32, and the deposition shield 46. By the combination of silicon and the oxygen, a compound of silicon oxide is formed, and the compound of silicon oxide is deposited on the wafer W to cover and protect the mask MK1.

Damage to the mask MK1 by subsequent steps is suppressed by these modification and protection effects. In step ST2, in order to obtain the modification by irradiation with secondary electrons and form a protective film, the bias power of the second radio-frequency power supply 64 may be minimized so as to suppress the release of silicon.

In step ST3 subsequent to step ST2, the antireflection film AL is etched. Specifically, as represented by symbol SRa in FIG. 6, from a gas source selected among the plurality of gas sources of the gas source group 40, a gas including a fluorocarbon-based gas is supplied into the processing space Sp of the processing container 12 through the gas supply pipe 38 and the gas inlet 36c. In this case, no gas is supplied from the gas inlet 52a as represented by symbol SRb in FIG. 6, or the backflow prevention gas is supplied into the processing space Sp of the processing container 12 through the gas supply pipe 82 and the gas inlet 52a as represented by a broken line of symbol SRb in FIG. 6.

In addition, radio-frequency power is supplied from the first radio-frequency power supply 62 as represented by symbol SRc in FIG. 6, and radio-frequency bias power is supplied from the second radio-frequency power supply 64 as represented by symbol SRd in FIG. 6. By operating the exhaust device 50, the pressure in the processing space Sp of the processing container 12 is set to a preset pressure. As a result, plasma of fluorocarbon-based gas is generated.

Active species including fluorine in the generated plasma etches a region, exposed from the mask MK1, of the entire region of the antireflection film AL. By this etching, a mask ALM is formed from the antireflection film AL as illustrated in FIG. 4B. The mask for the organic film OL formed in step ST3 includes the mask MK1 and the mask ALM.

Figure 4C:
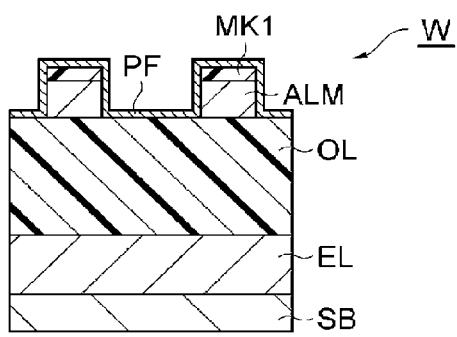

In step ST4 subsequent to step ST3, as illustrated in FIG. 4C, in the same manner as step ST2, a silicon oxide protective film PF is formed on the surface of the mask MK1, the surface of the mask ALM, and the surface of the organic film OL. When step ST4 is ended, the inside of the processing space Sp of the processing container 12 is purged. After step ST3, sequence SQ1 may be executed without performing step ST4.

Subsequent to step ST4, in method MT illustrated in FIG. 1, sequence SQ1 is executed one or more times. Sequence SQ1 includes steps ST5a to ST5f. Sequence SQ1 includes a first step (steps ST5a to ST5d) of forming a deposited film (a thin film forming a protective film SX) on the pattern of the wafer W, and a second step (steps ST5e and ST5f) of cleaning the processing space Sp by generating plasma in the processing space Sp by supplying power only to the upper electrode 30 subsequent to the first step. Together with a film forming step (steps ST5a to ST5d) for conformally forming a thin film (a film forming the protective film SX) on the main surface of the wafer W accommodated in the processing container 12 of the plasma processing apparatus 10 by the same method as an atomic layer deposition (ALD) method, as illustrated in FIG. 4B, the film forming step including sequence SQ1 and step ST6 includes a cleaning step (steps ST5e and ST5f) for cleaning a region, located above the wafer W (the ceiling side in the processing container 12), of the inside of the processing container 12, subsequent to the film forming step.

In the film forming step, sequence SQ1 including the thin film forming step and the cleaning step is repeatedly performed through step ST6 so as to form the protective film SX on the main surface of the wafer W as illustrated in FIG. 4D. When sequence SQ1 is executed once, a thin film (a film forming the protective film SX) is formed on the main surface of the wafer W by executing the thin film forming step, and the portion, located in the upper portion of the processing container 12 (on the ceiling side in the processing container 12), of the film formed inside the processing container 12 due to the formation of the film (the thin film SXa illustrated in FIG. 10) is removed by execution of the cleaning step.

In step ST5a, a first gas (gas G1) including the material of a precursor (layer Ly1) is supplied to the processing space Sp, and the precursor is adsorbed to the surface of a pattern (the pattern defined by the mask MK1). In step ST5a, the gas G1 is introduced into the processing space Sp of the processing container 12. Specifically, as represented by symbol SRb in FIG. 6, from a gas source selected among the plurality of gas sources of the gas source group 40, the gas G1 is supplied into the processing space Sp of the processing container 12 through the gas supply pipe 82 and the gas inlet 52a. In this case, no gas is supplied from the gas inlet 36 as represented by symbol SRa in FIG. 6, or the backflow prevention gas is supplied into the processing space Sp of the processing container 12 through the gas supply pipe 38 and the gas inlet 36 as represented by a broken line of symbol SRa in FIG. 6.

In step ST5a, the plasma of gas G1 is not generated as represented by symbols SRc and SRd in FIG. 6. The gas G1 is, for example, an organic-containing aminosilane-based gas. Gas G1 includes monoaminosilane (H3-Si—R (R is an amino group)) as the organic-containing aminosilane-based gas.

As illustrated in FIG. 7A, the molecules of the gas G1 adhere to the main surface of the wafer W as reaction precursors. The molecules of the gas G1 (e.g., monoaminosilane) adhere to the main surface of the wafer W by chemical adsorption based on chemical bonding, and plasma is not used. In step ST5a, the temperature of the wafer W is about 0° C. or higher, and about the glass transition temperature of the material contained in the mask MK1 or lower (e.g., about 200° C. or less).

It is also possible to use gases other than the monoamino silane as long as the gases are capable of adhering to the surface by chemical bonding in this temperature range and contain silicon. Since the diaminosilane ($H_2$—Si—$R_2$ (R is an amino group)) and triaminosilane (H—Si—$R_3$ (R is an amino group)) have molecular structures more complicated than the monoaminosilane, a heat treatment may also be performed on the diaminosilane and the triaminosilane in order to self-decompose amino groups in some cases in order to implement uniform film formation when the diaminosilane and the triaminosilane are used as the gas G1.

The reason why the monoaminosilane-based gas is selected as the gas G1 is that since monoaminosilane has a relatively high electronegativity and a molecular structure having polarity, chemisorption can be relatively easily performed. The layer Ly1 (see, e.g., FIG. 7B) formed by the molecules of the gas G1 adhering to the main surface of the wafer W becomes a state close to a monomolecular layer (a single layer) since the corresponding adsorption is chemisorption.

The smaller the amino group R of the monoaminosilane, the smaller the molecular structure of the molecules adsorbed on the main surface of the wafer W. Thus, steric hindrance caused due to the size of the molecules is reduced, and thus the molecules of the gas G1 are capable of being uniformly adsorbed on the main surface of the wafer W, and the layer Ly1 is capable of being formed in a uniform film thickness with respect to the main surface of the wafer W. For example, the reaction precursor H3-Si—O is formed by the reaction of the monoaminosilane (H3-Si—R) included in the gas G1 with the OH groups on the main surface of the wafer W, whereby the layer Ly1 which is a monomolecular layer of H3-Si-A is formed. Therefore, the layer Ly1 of the reaction precursor is capable of being conformally formed in a uniform film thickness without relying on the pattern density of the wafer W with respect to the main surface of the wafer W.

In step ST5b subsequent to step ST5a, the inside of the processing space Sp of the processing container 12 is purged. Specifically, the gas G1 supplied in step ST5a is exhausted. In step ST5b, an inert gas such as, for example, nitrogen gas may be supplied into the processing space Sp of the processing container 12 as a purge gas. That is, the purge in step ST5d may be either gas purge that causes the inert gas to flow into the processing space Sp of the processing container 12, or purge that is performed in a vacuum state. In step ST5b, molecules excessively adhering onto the wafer W may also be removed. As described above, the layer Ly1 of the reaction precursor becomes a very thin monomolecular layer.

Step ST5c subsequent to step ST5b is a step of generating plasma of the second gas (gas G2) and supplying the plasma to the precursor (the precursor which is formed in step ST5a and is the layer Ly1). In step ST5c, the plasma P1 of the gas G2 is generated in the processing space Sp of the processing container 12. In step ST5c, the temperature of the wafer W when the plasma P1 of the gas G2 is generated is 0° C. or higher and is equal to or lower than the glass transition temperature of the material included in the mask MK1 (e.g., 200° C. or lower). Specifically, as represented by symbol SRa in FIG. 6, from a gas source selected among the plurality of gas sources of the gas source group 40, the gas G2 including oxygen O is supplied into the processing space Sp of the processing container 12 through the gas supply pipe 38 and the gas inlet 36c. The gas G2 contains oxygen or nitrogen. The gas G2 may include, for example, oxygen ($O_2$) gas. In this case, no gas is supplied from the gas inlet 52a as represented by symbol SRb in FIG. 6, or the backflow prevention gas is supplied into the processing space Sp of the processing container 12 through the gas supply pipe 82 and the gas inlet 52a as represented by a broken line of symbol SRb in FIG. 6.

In addition, radio-frequency power is supplied from the first radio-frequency power supply 62 as represented by symbol SRc in FIG. 6, but the bias power of the second radio-frequency power supply 64 is not applied as represented by symbol SRd in FIG. 6. By operating the exhaust device 50, the pressure in the processing space Sp of the processing container 12 is set to a preset pressure. It is also possible to generate plasma using only the second radio-frequency power supply 64 without using the first radio-frequency power supply 62.

As described above, the molecules adhering to the main surface of the wafer W by execution of step ST5a (molecules forming the monomolecular layer of the layer Ly1) include bonds between silicon and hydrogen. The bonding energy between silicon and hydrogen is lower than the bonding energy between silicon and oxygen. Therefore, as illustrated in FIG. 7B, when the plasma P1 of the gas G2 including oxygen gas is generated, active species of oxygen (e.g., oxygen radicals) are generated, and the hydrogen of the molecules forming the monomolecular layer of the layer Ly1 is replaced by oxygen, and thus the layer Ly2 which is silicon oxide is formed as a monomolecular layer, as illustrated in FIG. 7C.

In step ST5d subsequent to step ST5c, the inside of the processing space Sp of the processing container 12 is purged. Specifically, the gas G2 supplied in step ST5c is exhausted. In step ST5d, an inert gas such as, for example, nitrogen gas, may be supplied into the processing space Sp of the processing container 12 as a purge gas. That is, the purge in step ST5*d* may be either gas purge that causes the inert gas to flow into the processing space Sp of the processing container 12, or purge that is performed in a vacuum state.

As described above, purge is performed in step ST5*b*, and hydrogen in the molecules forming the layer Ly1 is replaced with oxygen in step ST5*c* subsequent to step ST5*b*. Therefore, by executing the thin film forming step (steps ST5*a* to ST5*d*), a thin film (a film forming the protective film SX) having the film thickness in the level of an atomic layer is formed on the main surface of the wafer W. By performing the thin film forming step once, as in the ALD method, a layer Ly2 of silicon oxide is conformally formed on the main surface of the wafer W in a thin and uniform film thickness, regardless of the roughness and fineness of the mask MK1. Further, by executing the thin film forming step, a thin film SXa adheres to the inner surface of the processing container 12, as illustrated in the state CON2 in FIG. 10.

In step ST5*e* subsequent to step ST5*d*, the region above the wafer W inside the processing container 12 is cleaned. More specifically, in step ST5*e*, the upper electrode 30 side surface inside the processing container 12 is cleaned. In step ST5*e*, a portion, having adhered to the upper electrode 30 side surface, of the thin film SXa having adhered to the inner surface of the processing container 12 (a portion located above the wafer W in the processing container 12) by execution of the thin film forming step is removed as illustrated in the state CON3 in FIG. 10.

In step ST5*e*, the plasma of the third gas (gas G3) is generated in the processing space Sp. In step ST5*e*, the plasma of the gas G3 is generated in the processing space Sp of the processing container 12. In step ST5*e*, the plasma of the gas G3 is generated in the processing container 12 using radio-frequency electric power supplied from the upper electrode 30 above the wafer W. In step ST5*e*, no bias voltage using the second radio-frequency power supply 64 is applied. Specifically, as represented by symbol SRa in FIG. 6, from a gas source selected among the plurality of gas sources of the gas source group 40, the gas G3 is supplied into the processing space Sp of the processing container 12 through the gas supply pipe 38 and the gas inlet 36*c*. In this case, no gas is supplied from the gas inlet 52*a* as represented by symbol SRb in FIG. 6, or the backflow prevention gas is supplied into the processing space Sp of the processing container 12 through the gas supply pipe 82 and the gas inlet 52*a* as represented by a broken line of symbol SRb in FIG. 6.

In step ST5*e*, the following process conditions (hereinafter, referred to as a "condition group CND") are used. That is, the condition group CND includes a condition that radio-frequency power is supplied from the first radio-frequency power supply 62 as represented by symbol SRc in FIG. 6, but the bias power of the second radio-frequency power supply 64 is not applied as represented by symbol SRd in FIG. 6. The condition group CND also includes a wide gap condition. In the present description, the wide gap condition means a state in which the electrode interval is set to be 30 [mm] or more. For example, under the condition of a pressure of 100 [mTorr], reduction in a change of electron or ion density depending on the gap length has been experimentally confirmed when the electrode interval is less than 30 [mm]. Therefore, the electrode interval may be at least 30 [mm]. The condition group CND further includes a condition that the pressure in the processing space Sp of the processing container 12 is set to a relatively high preset pressure by operating the exhaust device 50. In the present description, the high pressure means a pressure of about 100 [mTorr] or higher. Under the pressure of 100 [mTorr] or higher, a mean free path is 1 [mm] or less, the incidence of radicals or ions to the wafer W side is sufficiently reduced, and the etching rate on the wafer W side is capable of being suppressed.

The etching rate in the cleaning in step ST5*e* is relatively higher on the upper electrode 30 side (the upper portion in the processing container 12) than on the wafer W side (the lower portion in the processing container 12) by the process conditions (condition group CND) in step ST5*e*. As described above, the condition group CND includes a condition for supplying only the radio-frequency power from the first radio-frequency power supply 62, a condition for setting the pressure in the processing space Sp of the processing container 12 to a relatively high pressure, and a wide gap condition.

The plasma density and the electron density may be unevenly distributed to the upper electrode 30 side by the condition that the radio-frequency power is supplied only from the first radio-frequency power supply 62, in the condition group CND. The respective density distributions of the plasma density and the electron density may be biased to the upper electrode 30 side by the condition for setting the pressure in the processing space Sp of the processing container 12 to a relatively high pressure and the wide gap condition, in the condition group CND.

The sheath width varies due to a variation of electron density, and the sheath voltage is determined by the anode/cathode ratio. In this description, the anode/cathode ratio means an area ratio. For example, the anode/cathode ratio may mean the ratio of the total areas obtained by summing the respective areas of the upper electrode 30 and the lower electrode LE and the respective areas of portions, which communicate with the upper and lower electrodes, respectively (which have the same potentials as respective electrodes). In the condition group CND, since the cathode includes the upper electrode 30, the anode includes the wafer W (the lower electrode LE) and the inner wall in the processing container 12, and the anode side region is relatively wider than the cathode side region, the sheath voltage is also reduced.

Figure 12:
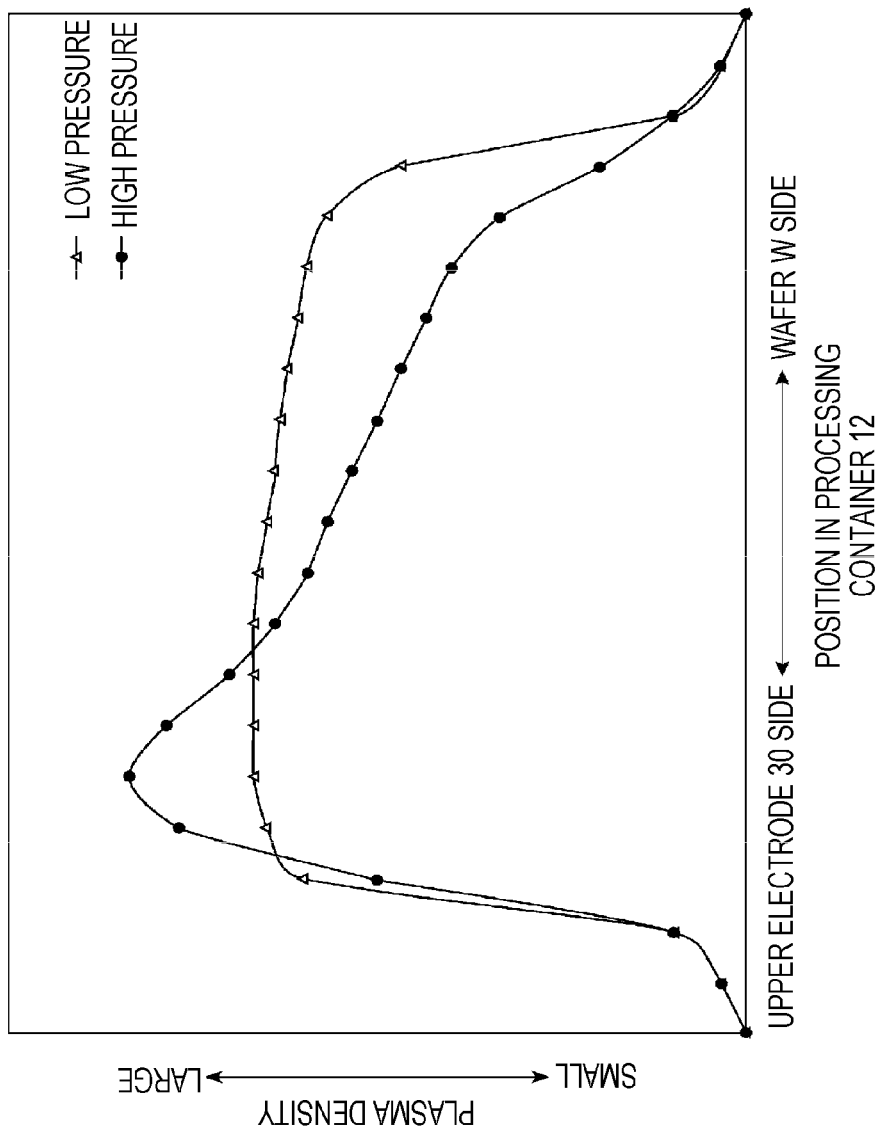
FIG. 12 is a view representing a correlation between a position in the processing container illustrated in FIG. 2 and a plasma density.
Figure 13:
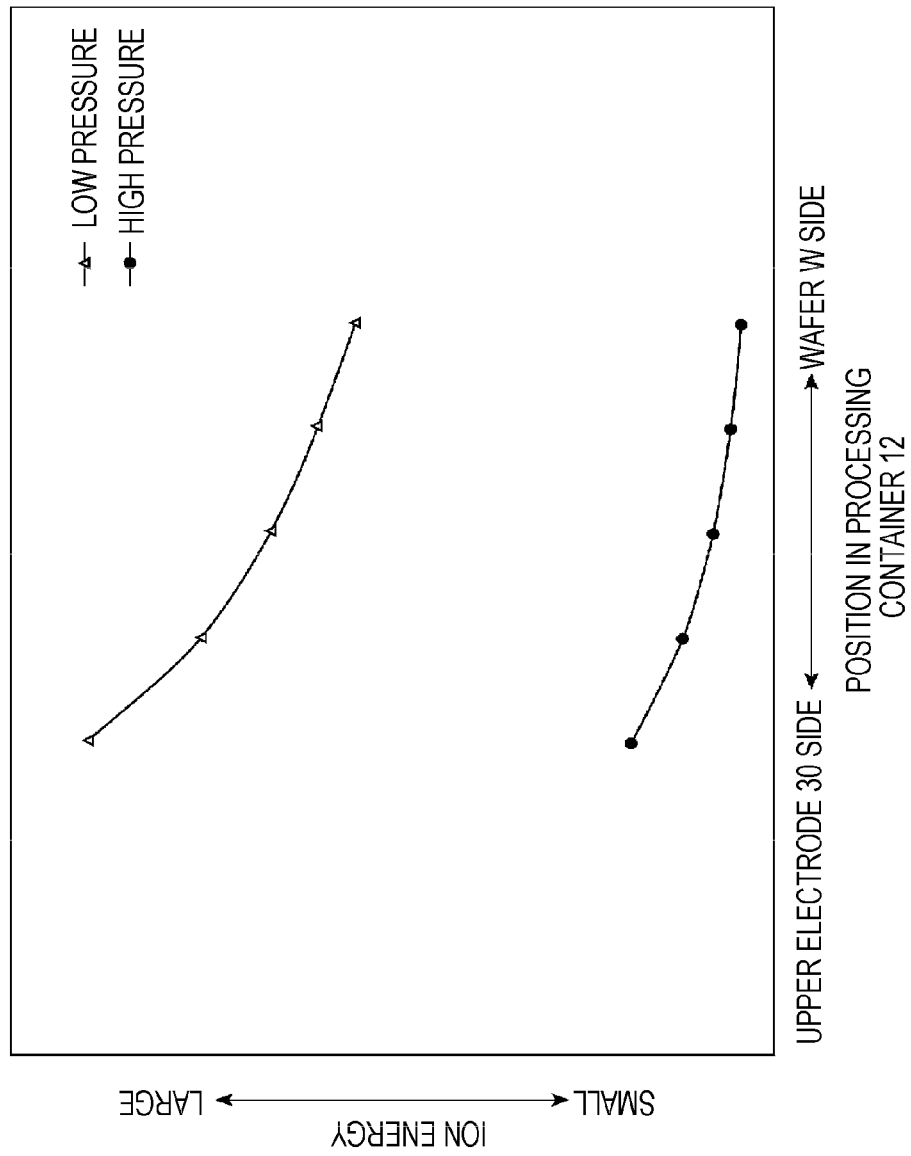
FIG. 13 is a view representing a correlation between a position in the processing container illustrated in FIG. 2 and a plasma density.

Accordingly, in the condition group CND, the electron density, the sheath voltage, and the ion energy are sufficiently reduced on the wafer W side separated from the upper electrode 30 as illustrated in FIGS. 12 and 13. Thus, in the cleaning of step ST5*e* in which the condition group CND is used, the etching rate is smaller on the wafer W side than on the upper electrode 30 side.

FIG. 12 illustrates a correlation between a position in the processing container 12 and a plasma density, in which the horizontal axis represents the position in the processing container 12 and the vertical axis represents the plasma density. FIG. 13 illustrates a correlation between a position in the processing container 12 and a plasma density, in which the horizontal axis represents the position in the processing container 12 and the vertical axis represents ion energy. Here, the plasma density means the electron density and the ion density in the plasma. Since the electron density and the ion density are substantially equal, the increase and decrease of the plasma density reflects the increase and decrease of the electron density and the ion density.

Figure 11:
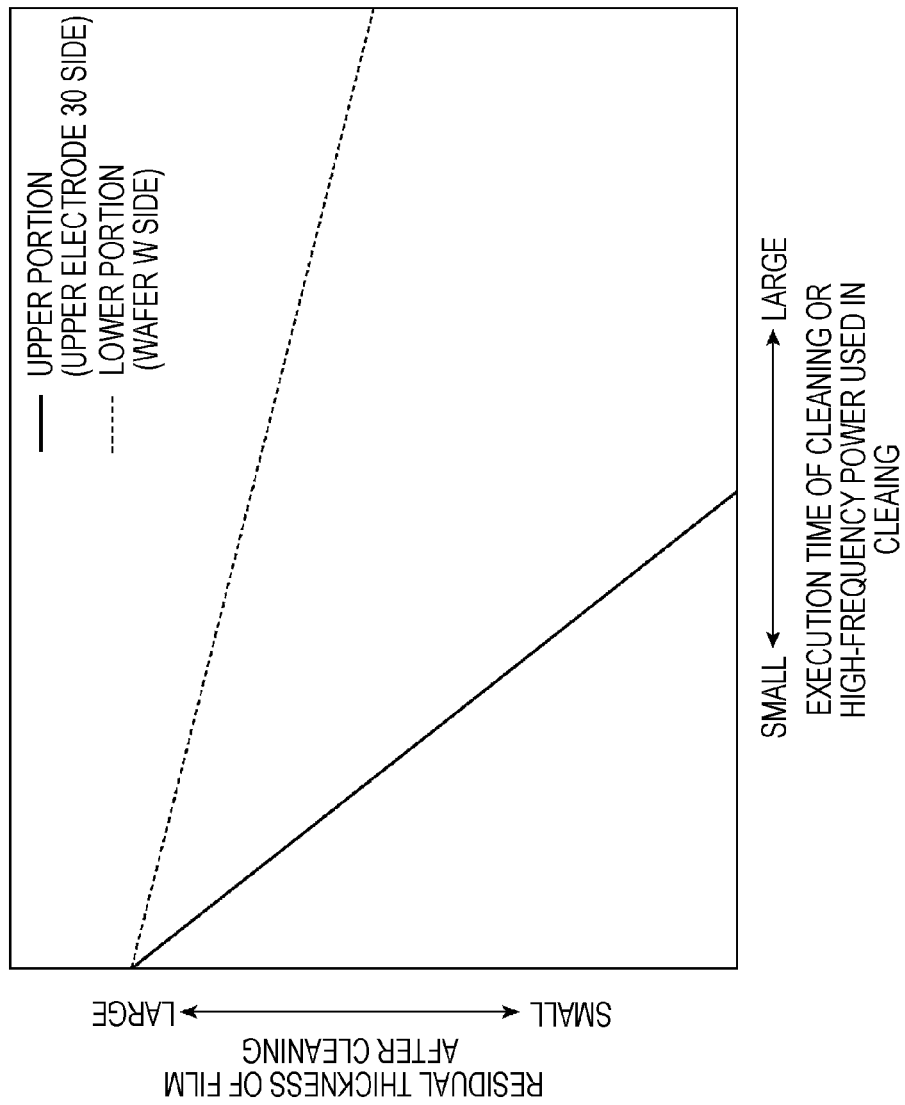
FIG. 11 is a view representing a correlation between an execution time of the cleaning step illustrated in FIG. 1 or radio-frequency power used in the cleaning step illustrated in FIG. 1 and a residual thickness of a film after cleaning.

According to the condition group CND, as illustrated in FIG. 11, removal of the thin film SXa on the upper electrode 30 side (the upper portion in the processing container 12) is completed faster than removal of the thin film SXa on the wafer W side (the lower portion in the processing container 12).

FIG. 11 is a view representing a correlation between an execution time of the cleaning of the cleaning step (step ST5e) illustrated in FIG. 1 or radio-frequency power used for cleaning in the cleaning step (step ST5e) illustrated in FIG. 1 and a residual thickness of a film SXa after the cleaning. The horizontal axis in FIG. 11 represents a cleaning execution time in step ST5e or the radio-frequency power of the first radio-frequency power supply 62 used for the cleaning in step ST5e, and the vertical axis in FIG. 11 represents the residual thickness of the thin film SXa after the cleaning in step ST5e.

In the cleaning in step ST5e, the etching amount (ET [nm]) on the upper electrode 30 side is the product of the etching rate (ER [nm/sec]) on the upper electrode 30 side and the etching time (ET [nm]=ER [nm/sec]×T [sec]). The etching time (T [sec]) is the cleaning execution time in step ST5e. Since the etching rate is roughly proportional to the radio-frequency power (RF [W]) of the first radio-frequency power supply 62, in the cleaning in step ST5e, the etching amount (ET [nm]) on the upper electrode 30 side is proportional to RF [W]×T [sec].

Therefore, when the film thickness (FT [nm]) of the thin film SXa on the upper electrode 30 side during the cleaning execution in step ST5e is set to the etching amount (ET [nm]) (FT [nm]=ET [nm]), it is possible to sufficiently remove the thin film SXa on the upper electrode 30 side while sufficiently suppressing etching on the wafer W as represented in FIG. 11 using RF [W] and T [sec] satisfying FT [nm]=RF[W]×T[sec]. In this manner, the combination of RF [W] and T [sec] that can be set in the cleaning in step ST5e may be suitably selected to match with the condition group CND with a relatively high degree of freedom.

The gas type of the gas G3 may be suitably selected depending on the combination of the gas type of the gas G1 and the gas type of the gas G2, that is, in particular, the material of the thin film SXa formed inside the processing container 12.

In the case where the thin film SXa is a material including $SiO_2$, for example, the gas G1 may be a gas including an organic-containing aminosilane-based gas or a gas including silicon tetrachloride ($SiCl_4$), and the gas G2 may be a gas including oxygen such as, for example, $O_2$ gas, $CO_2$ gas, or CO gas, and the gas G3 may be a gas containing a halogen compound and including fluorine (F) such as, for example, $CF_4$ gas, $NF_3$ gas, or $SF_6$ gas.

In the case where the thin film SXa is a material including tungsten (W), for example, the gas G1 may be a gas including a tungsten halide such as, for example, $WF_6$ gas, the gas G2 may be a gas including hydrogen ($H_2$), and the gas G3 may be a gas including fluorine (F) such as, for example, $CF_4$ gas, $NF_3$, gas, or $SF_6$ gas.

In the case where the thin film SXa is a material including titanium (Ti) such as, for example, TiO or TiN, for example, the gas G1 may be a gas including titanium tetrachloride ($TiCl_4$) or tetrakis(dimethylamino)titanium (TDMAT), the gas G2 may be a gas including water ($H_2O$) or ammonia ($NH_3$), and the gas G3 may be a gas including a halogen (e.g., F or Cl) such as, for example, $CF_4$ gas, $NF_3$ gas, $SF_6$ gas, or $Cl_2$ gas.

In the case where the thin film SXa is a material including boron (B) such as, for example, $BO_x$ or BN, for example, the gas G1 may be a gas including a boron halide such as, for example, $BBr_3$ gas or $BCl_3$ gas, the gas G2 may be a gas including water ($H_2O$) or ammonia, and the gas G3 may be a gas including halogen (e.g., F or Cl) such as, for example, $CF_4$ gas, $NF_3$ gas, $SF_6$ gas, or $Cl_2$ gas.

In the case where the thin film SXa is an organic film, both the gas G1 and the gas G2 include an organic compound gas. More specifically, in the case where the thin film SXa is an organic film, regarding the gas G1 and the gas G2, (a) the gas G1 may include an electron-donating substituent (a first substituent), and the gas G2 may include an electron-attracting substituent (a second substituent). Alternatively, (b) the gas G1 may include an electron-attracting substituent and the gas G2 may include an electron-donating substituent. In the case where the thin film SXa is an organic film, the gas G3 may be a gas including oxygen (O) such as, for example, $O_2$ gas, $CO_2$ gas, or CO gas. In the case where the thin film SXa is an organic film, the first step (steps ST5a to ST5d) is a step in which the gas G1 including an electron-donating substituent is supplied to the processing space Sp and an electron-donating substituent is adsorbed to the surface of a pattern (a pattern defined by unevenness formed on the main surface the wafer W, and a pattern defined by, for example, the mask M1), and the second step (steps ST5e to ST5f) is a step in which the gas G2 including an electron-attracting substituent is supplied to the electron-donating substituent. In this manner, a deposited film (a thin film forming a protective film SX) may be formed by the polymerization reaction between the material of the gas G1 including the electron-donating substituent and the material of the gas G2 including the electron-withdrawing substituent.

In the case where the thin film SXa is an organic film, no plasma is generated in step ST5c, and the thin film SXa which is an organic film is formed by polymerization or thermal polymerization of the material of the gas G1 and the material of the gas G2. Even in the case where the material of the gas G1 and the material of the gas G2 are polymerized or thermally polymerized, self-limiting works as in the ALD method.

In the case where the thin film SXa is an organic film, the temperature of the wafer W may be adjusted to, for example, 30° C. or higher and 200° C. or lower in the thin film forming step (particularly, steps ST5a and ST5c).

The case where the thin film SXa is an organic film will be described in more detail. In the following description in the case where the thin film SXa is an organic film, for convenience, one of the gas G1 and the gas G2 is referred to as a gas GA, and of the gas G1 and the gas G2, the remaining gas other than the gas GA is referred to as a gas GB.

In the case where the thin film SXa is an organic film (urea resin), for example, the gas GA may be a gas including a diamine compound having an electron-donating substituent, and the gas GB may be a gas including an isocyanate compound having an electron-attracting substituent. In the case where the thin film SXa is a urea resin, for example, the gas GA may be a gas including urea having an electron-donating substituent, and the gas GB may be a gas including an aldehyde compound having an electron-attracting substituent.

In the first step, a deposited film (a thin film forming the protective film SX) may be formed by a polymerization reaction of isocyanate and amine or a polymerization reaction of isocyanate and a hydroxyl group-containing compound.

In the case where the thin film SXa is a polyamide resin, for example, the gas GA may be a gas including a diamine compound having an electron-donating substituent, and the gas GB may be a gas including a dicarboxylic acid compound having an electron-attracting substituent.

In the case where the thin film SXa is a polyester resin, for example, the gas GA may be a gas including a diol compound having an electron-donating substituent, and the gas GB may be a gas including a dicarboxylic acid compound having an electron-attracting substituent.

In the case where the thin film SXa is a polycarbonate resin, for example, the gas GA may be a gas including a bisphenol compound having an electron-donating substituent, and the gas GB may be a gas including a phosgene compound having an electron-attracting substituent.

In the case where the thin film SXa is a polyurethane resin, for example, the gas GA may be a gas including an alcohol compound having an electron-donating substituent, and the gas GB may be a gas including an isocyanate compound having an electron-attracting substituent.

In the case where the thin film SXa is an epoxy resin, for example, the gas GA may be a gas including an amine compound or an acid anhydride having an electron-donating substituent, and the gas GB may be a gas including an epoxy compound having an electron-attracting substituent.

In the case where the thin film SXa is a phenol resin, for example, the gas GA may be a gas including a phenol compound having an electron-donating substituent, and the gas GB may be a gas including an aldehyde compound having an electron-attracting substituent.

In the case where the thin film SXa is a melamine resin, for example, the gas GA may be a gas including a melamine compound having an electron-donating substituent, and the gas GB may be a gas including an aldehyde compound having an electron-attracting substituent.

In step ST5$e$ subsequent to step ST5$d$, the inside of the processing space Sp of the processing container 12 is purged. Specifically, the gas G3 supplied in step ST5$e$ is exhausted. In step ST5$f$, an inert gas such as, for example, nitrogen gas, may be supplied into the processing space Sp of the processing container 12 as a purge gas. That is, the purge in step ST5$f$ may be either gas purge that causes the inert gas to flow into the processing space Sp of the processing container 12, or purge that is performed in a vacuum state.

In step ST6 subsequent to sequence SQ1, it is determined whether or not execution of sequence SQ1 is ended. Specifically, in step ST6, it is determined whether or not the number of times of execution of sequence SQ1 has reached a preset number of times. The determination of the number of times of execution of sequence SQ1 is to determine the film thickness of the protective film SX deposited on the wafer W.

That is, by the product of the film thickness of the thin film formed by executing sequence SQ1 once (a unit cycle) and the number of times of execution of sequence SQ1, the film thickness of the protective film SX finally formed on the wafer W is substantially determined. Accordingly, the number of times of execution of sequence SQ1 is set depending on the desired film thickness of the protective film SX formed on the wafer W.

When it is determined in step ST6 that the number of times of execution of sequence SQ1 has not reached the preset number (step ST6: NO), execution of sequence SQ1 is repeated again. Meanwhile, when it is determined in step ST6 that the number of times of execution of sequence SQ1 has reached the preset number (step ST6: NO), execution of sequence SQ1 is ended, and the process proceeds to step ST7.

As a result, as illustrated in FIG. 4D, a silicon oxide protective film SX is formed on the main surface of the wafer W. That is, by repeating sequence SQ1 by a preset number of times, the protective film SX having a preset film thickness is conformally formed on the main surface of the wafer W as a uniform film, irrespective of the roughness and fineness of the mask MK1.

As illustrated in FIG. 4D, the protective film SX includes regions R11, R21, and R31. The regions R31 are regions extending on the side surface of the mask MK1 and the side surface of the mask ALM along the side surfaces. The regions R31 extend from the surface of the organic film OL to the lower side of the regions R11. The regions R11 extend on the top surface of the mask MK1 and on the regions R31. The regions R21 extends between the adjacent regions R31 and on the surface of the organic film OL.

As described above, since in sequence SQ1, the protective film SX is formed by a method which is the same as the ALD method, the respective film thicknesses of the regions R11, R21, and R31 are substantially equal to each other irrespective of the roughness and fineness of the mask MK1.

Since the film thickness of the protective film SX formed in the film forming steps of sequence SQ1 and step ST6 increases or decreases depending on the temperature of the main surface of the wafer W, it is possible to perform a step of adjusting the film thickness of the protective film SX on the main surface of the wafer W (hereinafter, referred to as a heat adjustment process in some cases) by adjusting the temperature of the main surface of the wafer W using a temperature adjustment unit HT for each of the plurality of regions ER (see, e.g., FIG. 3) before execution of sequence SQ1 after execution of step ST4. In one embodiment, this temperature adjustment step may be included in step ST1 (a step of providing a wafer), but not limited to this. The temperature adjustment step may be executed, for example, after step ST4 if it is before step ST5$a$ is executed.

In the above-described temperature adjustment process, using corresponding data DT obtained in advance and representing a correspondence between the temperature of the main surface of the wafer W in the film forming steps of sequence SQ1 and step ST6 and the film thickness of a film (the film formed through the film forming steps of sequence SQ1 and step ST6) deposited on the inner surface of a trench (a trench included in the pattern formed on the main surface of the wafer W), the controller Cnt controls the temperature of the main surface of the wafer W for each of a plurality of regions ER such that the variation of the trench width in the main surface of the wafer W due to the formation of the film in the trench (or such that the trench width is set to a desired width for each region ER on the main surface of the wafer W). The corresponding data DT is data obtained in advance by depositing the film on the main surface of the wafer W under the same conditions (conditions excluding the temperature of the main surface of the wafer W) as those of the film forming steps of the sequence SQ1 and the step ST6 for each temperature of the main surface of the wafer W, and is readably stored in a storage unit of the controller Cnt.

That is, in the temperature adjustment step, the controller Cnt adjusts the temperature of the main surface of the wafer for each region ER using the temperature adjustment unit HT and the corresponding data DT such that the temperature of the main surface of the wafer W becomes the temperature corresponding to the desired film thickness for each region ER. By performing the film forming steps of the sequence SQ1 and the step ST6 on the main surface of the wafer W the temperature of which has been adjusted by the temperature adjustment step, it is possible to set the trench width on the main surface of the wafer W to a desired width, and in particular, it is possible to reduce the variation in the trench width.

A description will be made with reference to FIG. 8. Line GRa indicated in FIG. 8 represents a correspondence between the film thickness of a thin film (a film forming the protective film SX) formed by sequence SQ1 and the temperature of the main surface of a wafer W on which the film is formed, and corresponds to an Arrhenius equation (Arrhenius plot). The horizontal axis in FIG. 8 represents the temperature of the main surface of the wafer W on which the thin film is formed by sequence SQ1. The vertical axis in FIG. 8 represents the film thickness of the thin film formed by sequence SQ1. In particular, the film thickness represented on the horizontal axis in FIG. 8 is the film thickness of the thin film formed in a time equal to or longer than a time to reach the self-limited region in the ALD method used in sequence SQ1.

As illustrated in FIG. 8, when the temperature of the main surface of the wafer W has a value T1, the film thickness of the film formed on the main surface of the wafer W has a value W1, and the temperature of the main surface of the wafer W has a value T2 (T2>T1), the film thickness of the film formed on the main surface of the wafer W has a value W2 (W2>W1). As described above, in the case of using the ALD method, the higher the temperature of the main surface of the wafer W, the thicker the film thickness of the protective film SX formed on the main surface can be made.

The correlation between the temperature of the main surface of the wafer W and the thickness of a precursor (layer Ly1) used for forming the protective film SX will be described. The thickness of the precursor (layer Ly1) illustrated in FIGS. 7A to 7C may be increased or decreased according to the temperature of the main surface of the wafer W, but the degree of the correlation between the thickness of the precursor and the temperature of the main surface of the wafer W depending on the environment within the container 12.

Figure 14:
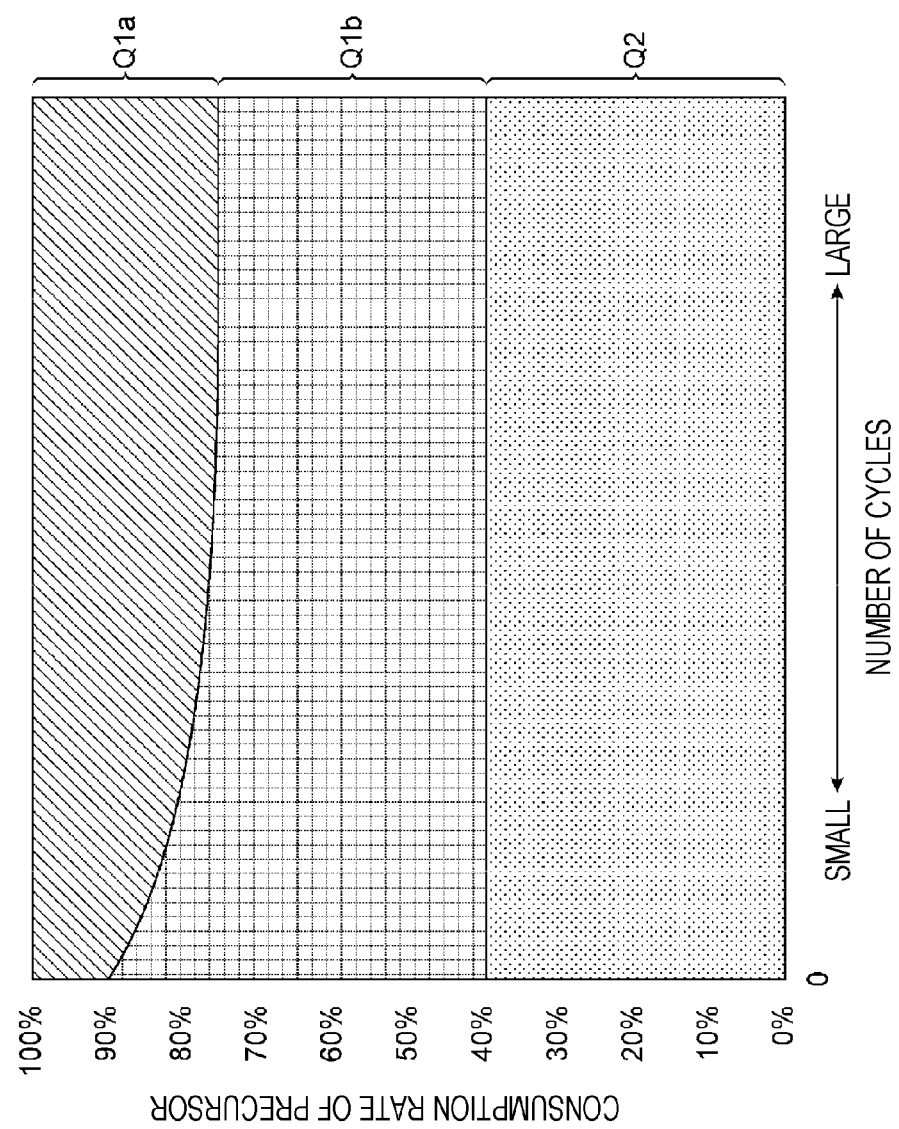
FIG. 14 is a view representing a correlation between the consumption rate of a precursor in a processing container and the number of cycles of atomic layer deposition (ALD).

As illustrated in FIG. 14, the gas including the material of the precursor (in an embodiment, gas G1) is consumed by any of adsorption of the precursor to the adsorption target surface (in one embodiment, the main surface of the wafer W), adsorption of the precursor to the inner wall surface of the container 12, and exhaust as it is without being adsorbed in the processing container 12. FIG. 14 is a view illustrating a correlation between the consumption rate of the precursor in the processing container 12 and the number of cycles of the ALD (in an embodiment, the thin film forming steps of steps ST5a to ST5d). In FIG. 14, the horizontal axis represents the number of cycles of the ALD and the vertical axis of FIG. 14 represents the consumption rate of the precursor.

As illustrated in FIG. 14, the sum of the proportion of the precursor adsorbed on the adsorption target surface (region Q1a) and the proportion of the precursor adsorbed on the inner wall surface of the processing container 12 (region Q1b) is larger than the proportion of the precursor which is not adsorbed but exhausted as it is (region Q2).

In the ALD, the precursor is chemisorbed onto the adsorption target surface and is adsorbed by one atomic layer. In this case, it is necessary for a specific substituent for chemisorption (chemical bonding) of the precursor be exposed on the adsorption target surface, but a substitution required for chemisorption is not exposed on the inner wall surface of the processing container 12 immediately after cleaning. Therefore, at the beginning of a plurality of cycles of ALD, the precursor may be adsorbed onto the inner wall surface of the processing container 12 by physisorption rather than chemisorption, and in multiple layers rather than one layer, whereby extra precursor may be consumed.

Figure 15:
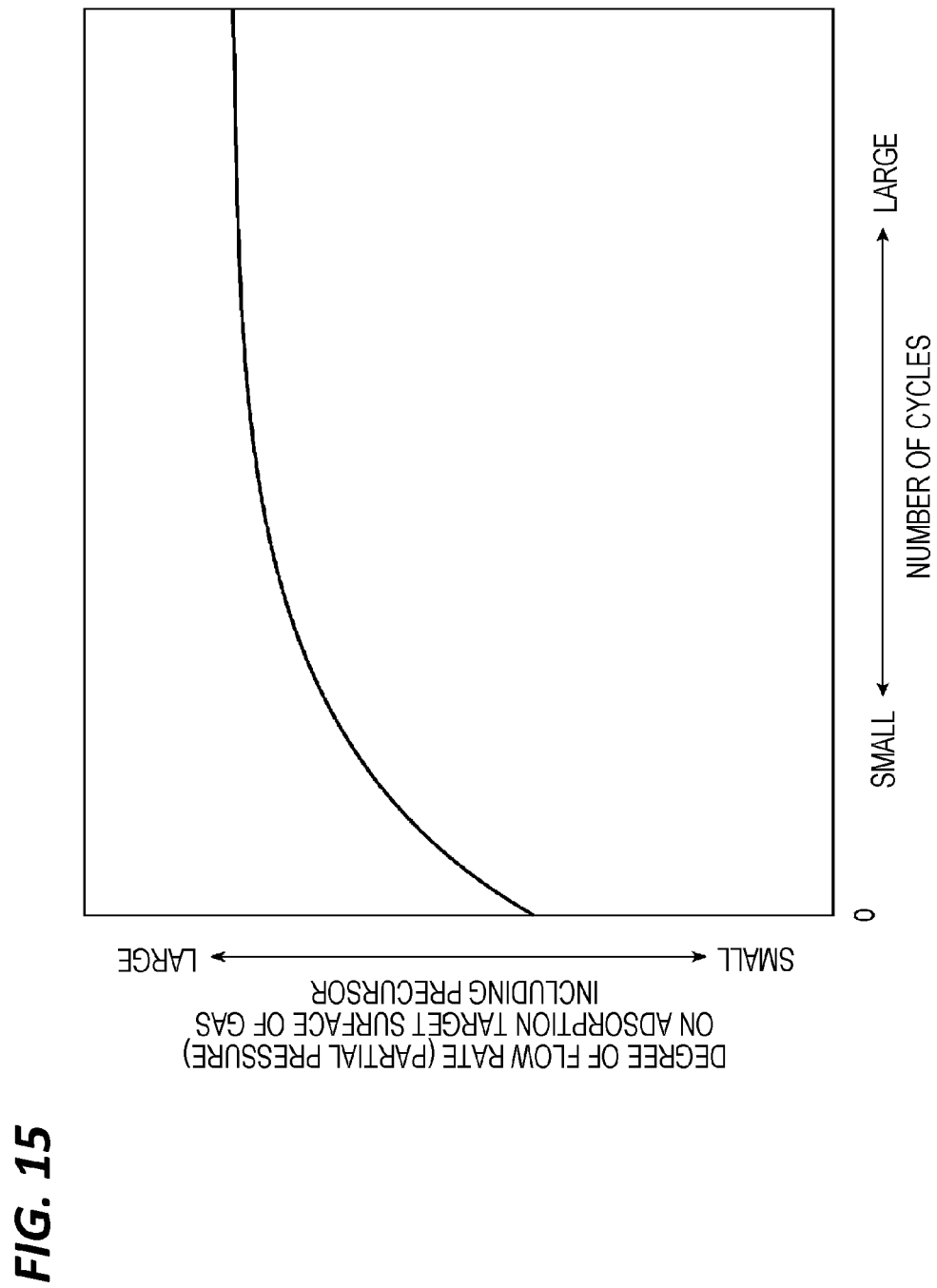
FIG. 15 is a view representing a correlation between the degree of flow (partial pressure) on an adsorption target surface of a gas including a precursor material and the number of cycles of ALD.

Therefore, at the beginning of the plurality of cycles of ALD, as represented in FIG. 15, the degree of the flow rate (partial pressure) of the precursor reaching the adsorption target surface is relatively small. Under such a low flow rate condition of the gas including the material of the precursor, the influence of the variation of the number of molecules corresponding to several atomic layers is relatively large, and therefore, it is possible to realize high resolution in controlling the film thickness.

FIG. 15 is a graph representing a correlation between the degree of the flow rate (partial pressure) of the gas including the material of the precursor on the adsorption target surface of the gas including the precursor material and the number of cycles of ALD. The horizontal axis of FIG. 15 represents the number of cycles of ALD, and the vertical axis of FIG. 15 represents the degree of flow rate (partial pressure) on the adsorption target surface of the gas including the material of the precursor.

Meanwhile, in the latter stage of the plurality of cycles of ALD, a film is formed on the inner wall surface of the processing container 12, and a substituent necessary for chemisorption is exposed on the surface. As a result, the inner wall surface of the processing container 12 consumes the precursor only by one atomic layer, and as a result, as illustrated in FIG. 15, the degree of flow rate (partial pressure) of the gas including the material of the precursor reaching the adsorption target surface increases. In this way, as the number of cycles of ALD increases, the degree of flow rate (partial pressure) on the adsorption target surface of the gas including the precursor material increases.

Figure 16:
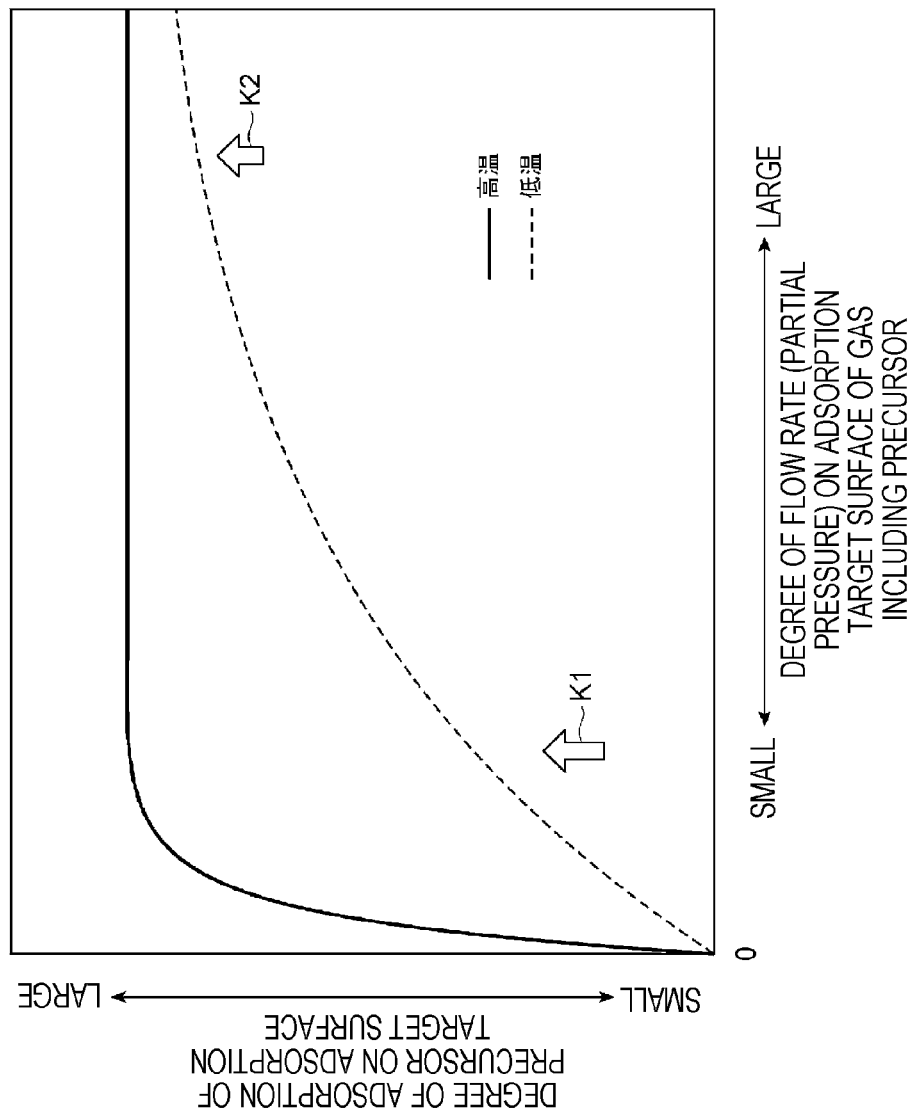
FIG. 16 is a view representing the temperature dependence of the correlation between the degree of the flow rate (partial pressure) on the adsorption target surface of the gas including the precursor material and the degree of adsorption amount of the precursor on the adsorption target surface.

The adsorption amount of the precursor on the adsorption target surface varies depending on the temperature of the adsorption target surface. FIG. 16 is a view representing the temperature dependence of a correlation between the degree of the flow rate (partial pressure) on the adsorption target surface of the gas including the precursor material and the degree of adsorption amount of the precursor on the adsorption target surface. The horizontal axis in FIG. 16 represents the degree of flow rate (partial pressure) on the adsorption target surface of the gas including the precursor material, and the vertical axis in FIG. 16 represents the degree of adsorption amount of the precursor on the adsorption target surface.

As illustrated in FIG. 16, in the ALD, the adsorption amount of the precursor on the adsorption target surface depends on the degree of flow rate (partial pressure) on the adsorption target surface of the gas including the material of the precursor and the temperature of the adsorption target surface. In the case where the temperature of the adsorption target surface is relatively low (the broken line in FIG. 16), when the degree of flow rate (partial pressure) of the gas including the material of the precursor on the adsorption target surface is relatively small (region K1), the degree of adsorption amount of the precursor on the adsorption target surface is relatively small, and as the degree of flow rate (partial pressure) of the gas including the material of the precursor on the adsorption target surface becomes relatively large (region K2), the degree of adsorption amount of the precursor on the adsorption target surface also increases, and the adsorption amount of the precursor approaches a saturation value.

On the other hand, in the case where the temperature of the adsorption target surface is relatively high (the solid line in FIG. 16), even when the degree of flow rate (partial pressure) on the adsorption target surface of the gas including the precursor material is relatively small (region K1), the degree of adsorption amount of the precursor on the adsorbed surface is large. Therefore, the degree of adsorption amount of the precursor on the adsorption target surface becomes substantially the degree of saturation adsorption amount on the adsorption target surface of the gas including the material of the precursor over a relatively wide range (region K2).

In an embodiment, as in sequence SQ1, since the inside of the processing container 12 is cleaned (steps ST5e to ST5f) whenever each cycle of ALD (steps ST5a to ST5d) is executed, the inside of the processing container 12 is always in a state after cleaning when executing each cycle of ALD. Since the state after cleaning of the inside of the processing container 12 corresponds to the state of the inside of the processing container 12 at the beginning of the plurality of cycles of ALD as illustrated in FIGS. 14 and 15, in an embodiment, the degree of flow rate (partial pressure) on the adsorption target surface (the main surface of the wafer W) of the gas (gas G1) including the material of the precursor is always relatively small at the time of executing each cycle of ALD (steps ST5a to ST5d). Accordingly, this corresponds to the case of the region K1 in FIG. 16, and the degree of adsorption amount of the precursor on the main surface of the wafer W is able to sufficiently effectively increase or decrease depending on the increase or decrease of the temperature of the main surface of the wafer W.

Figure 17:
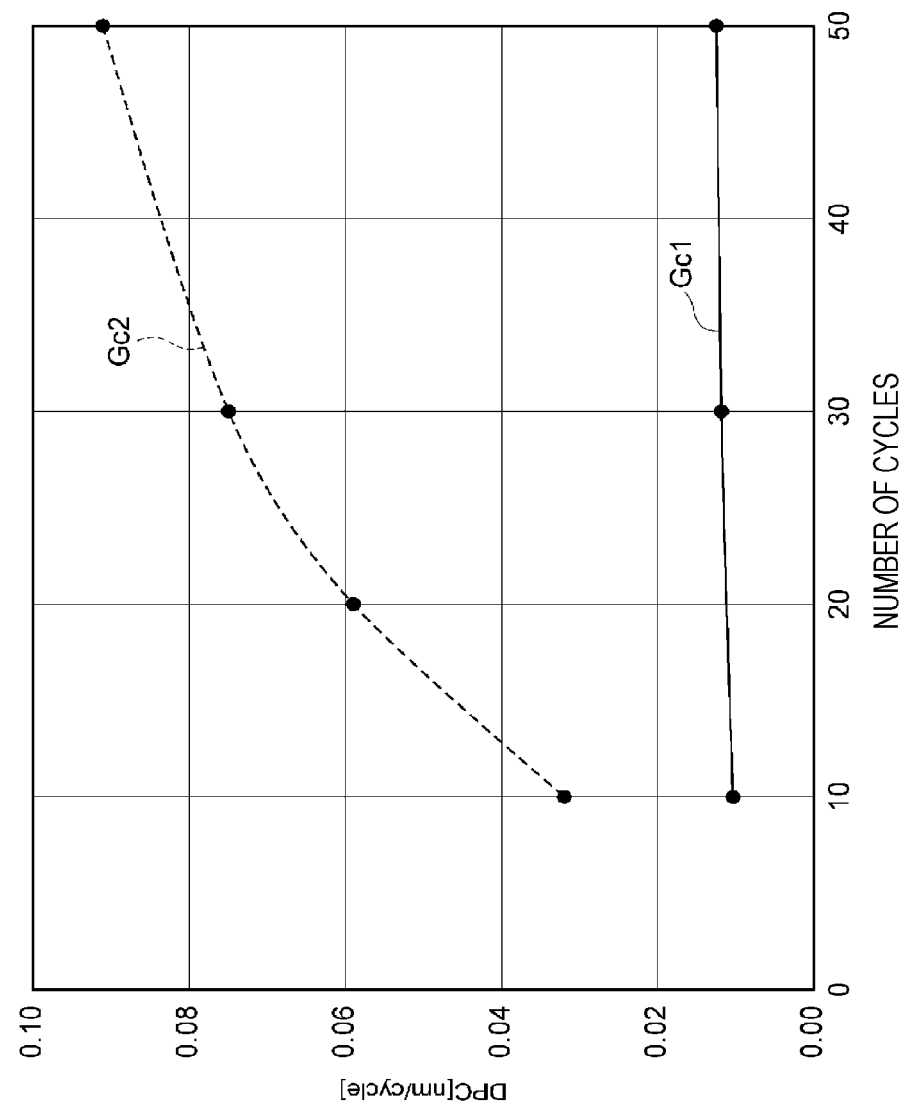
FIG. 17 is a view for comparing DPC in the case of performing cleaning in each cycle of ALD and DPC in the case of not performing cleaning.

When the inside of the processing container 12 is cleaned (steps ST5e and step ST5f) whenever each cycle of ALD (steps ST5a to ST5d) is executed as in the sequence SQ1, deposition per cycle (DPC) [nm/cycle] on the adsorption target surface (the main surface of the wafer W) is maintained substantially constant with a relatively small value, regardless of an increase in the number of cycles, as represented by line Gc1 in FIG. 17. On the other hand, when cleaning is not performed whenever each cycle of ALD is executed, DPC [nm/cycle] on the adsorption target surface increases as the number of cycles of ALD increases, as represented by line Gc2 in FIG. 17.

FIG. 17 is a view for comparing DPC in the case of performing cleaning in each cycle of ALD and DPC in the case of not performing cleaning. The horizontal axis in FIG. 17 represents the number of cycles of ALD and the vertical axis in FIG. 17 represents DPC [nm/cycle] on the absorption target surface.

In addition, by suppressing the adsorption amount of the precursor on the main surface of the wafer W to a relatively small value as described above, it is possible to control DPC [nm/cycle] in units smaller than one atomic layer. In an embodiment, the adsorption amount (the number of molecules) when one atomic layer is adsorbed to the total area of the main surface of the wafer W and the inner wall surface inside the processing container 12 is set to, for example, 20% or more of the supply amount (the number of molecules) of the precursor per cycle of ALD. That is, when the supply amount of the precursor is not sufficiently large relative to the total amount of the precursor that only covers the main surface of the wafer W and the entire inner wall surface of the processing container 12, the partial pressure of the precursor becomes small. Therefore, a difference in adsorption amount due to a temperature difference is likely to occur. In order to satisfy this condition, there are two methods, that is, setting the flow rate of the gas G1 including the material of the precursor to be sufficiently low, and increasing the volume of the processing container 12.

Figure 18:
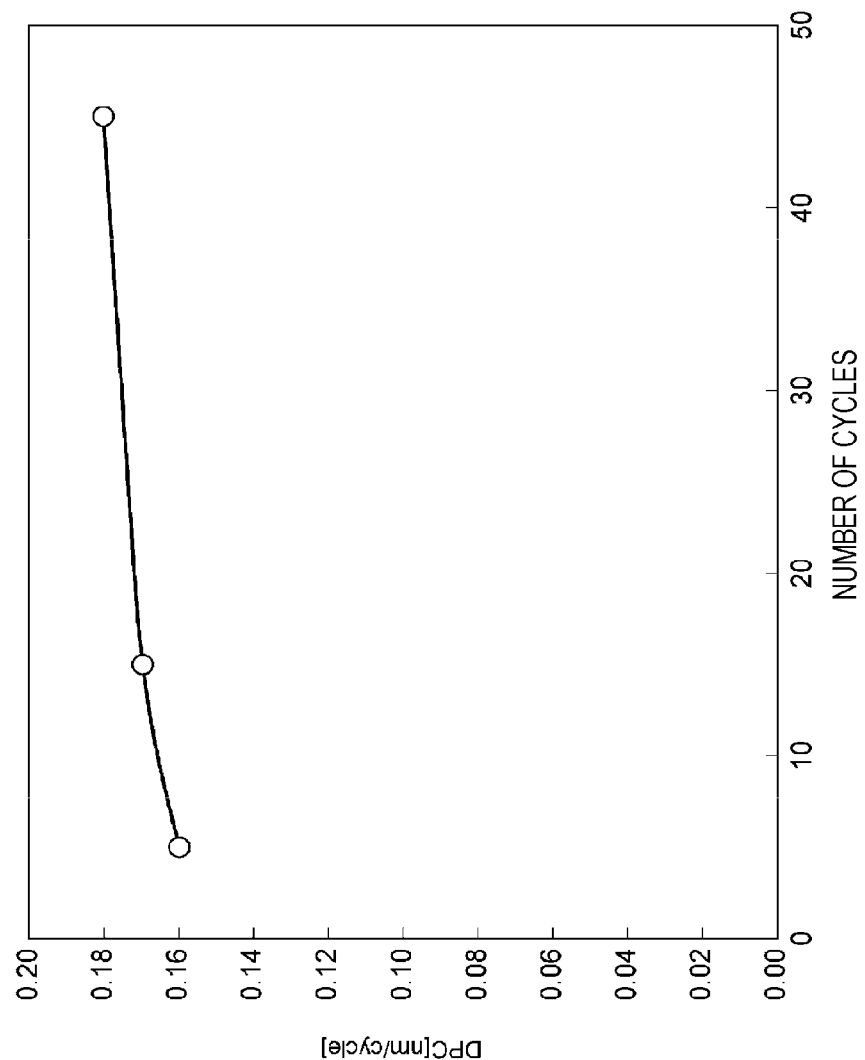
FIG. 18 is a view representing a correlation between the number of cycles of ALD and DPC in a processing container in which cleaning is not performed.

In the case where the inside of the processing container 12 is not cleaned, as illustrated in FIG. 18, the film thickness DCP [nm/cycle] that can be formed per cycle is relatively large, but may become a substantially constant value, regardless of an increase in the number of cycles of ALD. FIG. 18 is a view representing a correlation between the number of cycles of ALD and DPC in a processing container 12 in which cleaning has not been performed. The horizontal axis in FIG. 18 represents the number of cycles of ALD, and the vertical axis in FIG. 18 represents DPC [nm/cycle].

The thickness of the film formed on the main surface of the wafer W may vary depending on the temperature of the main surface of the wafer W. However, when the formation of the deposited film is repeated without performing the cleaning as represented in FIG. 18, the degree of the change in the film thickness depending on the temperature of the main surface of the wafer W is reduced, and thus the temperature adjustment of the main surface of the wafer W may not be performed effectively in some cases. On the other hand, in the film forming method in method MT according an embodiment, formation of a deposited film is performed after the temperature of the main surface of the wafer W is adjusted, but cleaning is also performed whenever the formation of the deposited film is performed. Thus, even if the formation of the deposited film is repeated, the temperature adjustment of the main surface of the wafer W is capable of functioning sufficiently effectively in controlling the thickness of the deposited film on the main surface of the wafer W. In addition, since corresponding data DT acquired in advance is used, the temperature of the main surface of a wafer W may be more accurately and reproducibly adjusted.

Figure 19:
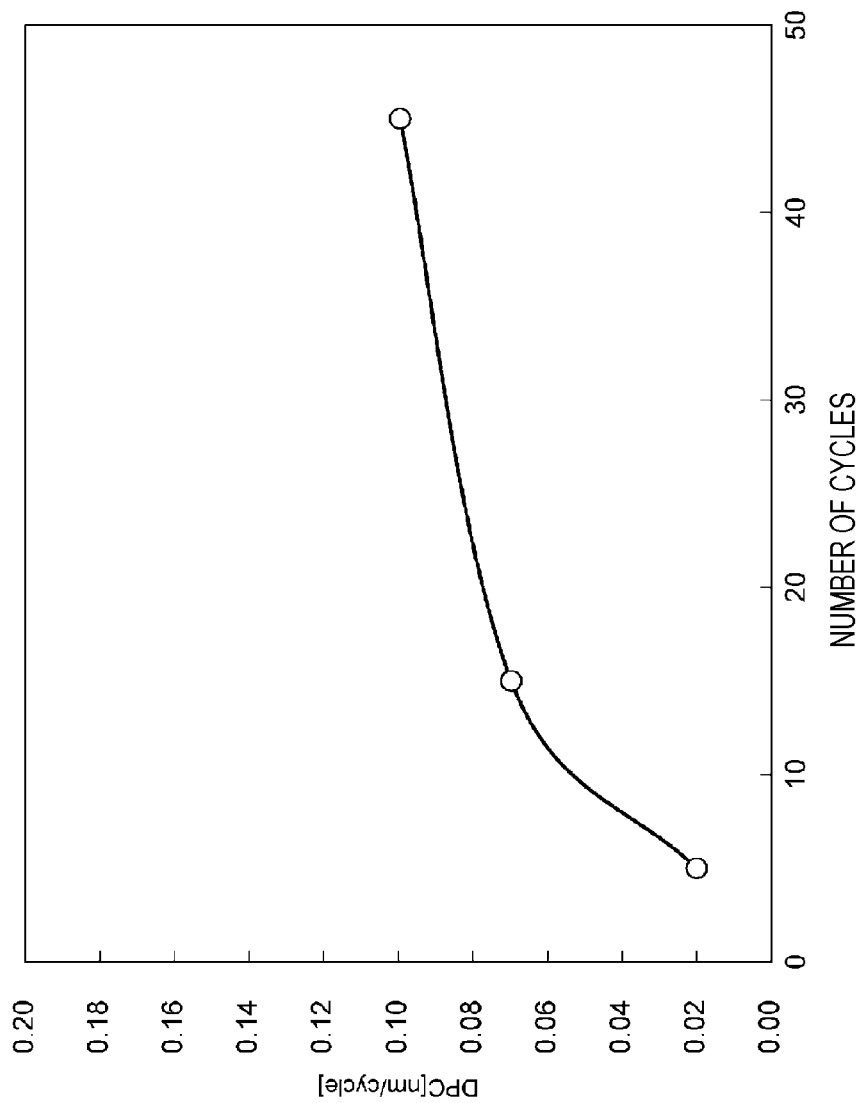
FIG. 19 is a view representing a correlation between the number of cycles of ALD and DPC in a processing container in which cleaning is performed.

In fact, in the case where the inside of the processing container 12 is cleaned, as represented in FIG. 19, the film thickness DCP [nm/cycle] that can be formed per cycle is relatively small, and the DCP [nm/cycle] also increases as the number of cycles of ALD increases. FIG. 19 is a view representing a correlation between the number of cycles of ALD and DPC in a processing container 12 in which cleaning has been performed. The horizontal axis in FIG. 19 represents the number of cycles of ALD, and the vertical axis in FIG. 19 represents DPC [nm/cycle].

As described above, sequence SQ1 includes a thin film forming step (steps ST5a to ST5d) in which film formation is performed by a method which is the same as the ALD method, and a cleaning step (steps ST5e and ST5f) of cleaning the inner portions of the processing container 12 in the upper side of the wafer W (the ceiling side within the processing container 12) whenever the thin film forming step is executed once. Since the thin film forming step is the same method as the ALD method, the film thickness of the film formed inside the processing container 12 by one thin film forming step is the film thickness at the level of an atomic layer. For this reason, in the cleaning step executed whenever the thin film forming step is executed, since the film having the film thickness at the level of the atomic layer is removed, it is possible to sufficiently remove the portion, located above the wafer W, of the film inside the processing container 12 even if the time for executing the cleaning step is sufficiently short.

For example, the processing time for repeating sequence SQ1 20 times on one wafer W may be made shorter, compared to the processing time which is the sum of the processing time for repeating only the thin film forming step 20 times without performing the cleaning step and the processing time for cleaning the inside of the processing container 12 only one time (including the processing time required for transporting the wafer in the case of cleaning using the wafer).

Figure 20:
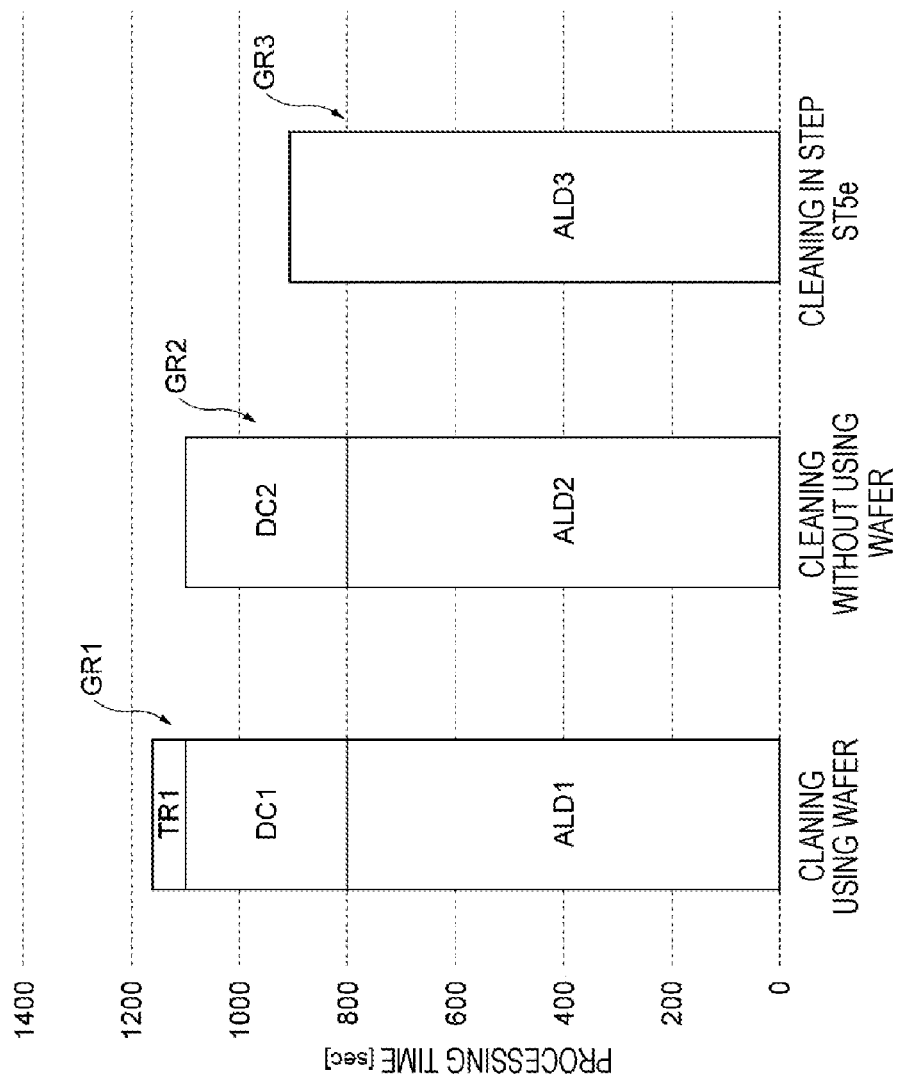
FIG. 20 is a view representing a breakdown of a processing time for each substrate.
Figure 21:
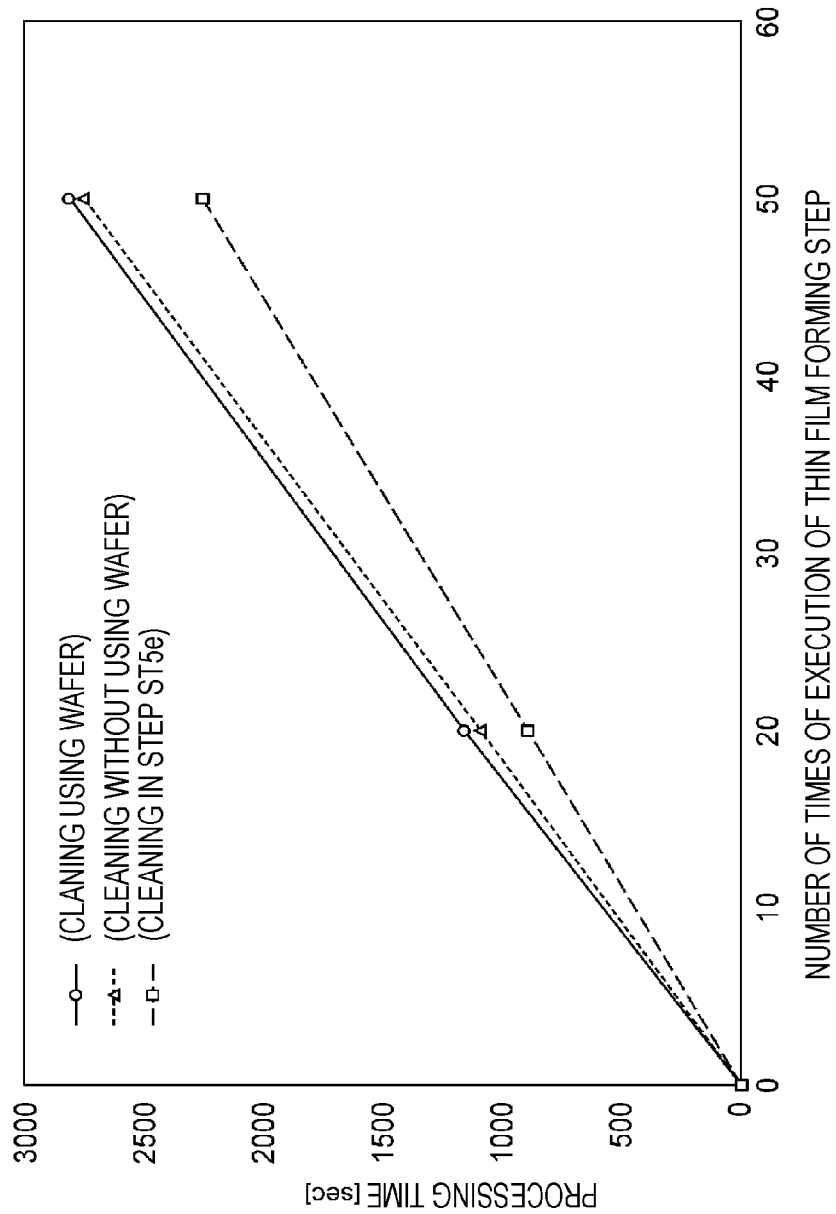
FIG. 21 is a view representing a correlation between the number of repetitions of a thin film forming step and a processing time for each substrate.

FIG. 20 is a view representing a breakdown of the processing time of each wafer W in the case where the thin film forming process has been performed 20 times. FIG. 21 is a view representing a correlation between the number of times of repeating the thin film forming process for each wafer W and the processing time.

The breakdown of the processing time (referred to as a "processing time TP1") in the case where only the thin film forming step is repeated 20 times without performing the cleaning step and the cleaning of the inside of the processing container 12 is performed only one time using a wafer after repeatedly performing the thin film forming step 20 times is represented in the rectangle GR1 in FIG. 20. In the rectangle GR1, the portion indicated by symbol ALD1 represents the processing time for 20 times of the thin film forming process. Assuming that the processing time for one time of the thin film forming process is about 40 [sec/time], the processing time for 20 times of the thin film forming process is about 800 [sec] (=40 [sec/time]×20 [times]).

In the rectangle GR1, the portion indicated by symbol DC1 represents the processing time required for cleaning the inside of the processing container 12 when the thin film forming process has been repeatedly performed 20 times. When the thin film forming process has been repeatedly performed 20 times, the processing time required for cleaning the inside of the processing container 12 is about 300 [sec]. In the rectangle GR1, the portion indicated by symbol TR1 represents the processing time required for transporting the wafer used for cleaning the inside of the processing container 12. The processing time required for transporting the wafer is about 60 [sec].

Accordingly, the processing time indicated by the rectangle GR1, that is, the processing time TP1 in the case where the thin film forming step is repeated 20 times without performing the cleaning step and cleaning of the inside of the processing container 12 is performed only one time using a wafer after repeatedly performing the thin film forming step 20 times is about 1160 [sec].

In addition, the breakdown of the processing time (referred to as a "processing time TP2") in the case where only the thin film forming step is repeated 20 times without performing the cleaning step and the cleaning of the inside of the processing container 12 is performed only one time without using a wafer after repeatedly performing the thin film forming step 20 times is represented in the rectangle GR2 in FIG. 20. In the rectangle GR2, the portion indicated by symbol ALD2 represents the processing time for 20 times of the thin film forming process. Assuming that the processing time for one time of the thin film forming process is about 40 [sec/time], the processing time for 20 times of the thin film forming process is about 800 [sec] (=40 [sec/time]×20 [times]).

In the rectangle GR2, the portion indicated by symbol DC2 represents the processing time required for cleaning the inside of the processing container 12 when the thin film forming process has been repeatedly performed 20 times. When the thin film forming process has been repeatedly performed 20 times, the processing time required for cleaning the inside of the processing container 12 is about 300 [sec].

Accordingly, the processing time indicated by the rectangle GR2, that is, the processing time TP2 in the case where the thin film forming step is repeated 20 times without performing the cleaning step and cleaning of the inside of the processing container 12 is performed only one time without using a wafer after repeatedly performing the thin film forming step 20 times is about 1100 [sec].

Meanwhile, a breakdown of the processing time (referred to as a "processing time TP3") when sequence SQ1 including a thin film forming step and a cleaning step performed after the thin film forming step is repeatedly performed 20 times is represented in the rectangle GR3 in FIG. 20. In the rectangle GR3, the portion indicated by symbol ALD3 represents the processing time for 20 times of sequence SQ1 including the thin film forming step and the cleaning step performed after the thin film forming step. Assuming that the processing time of one time of sequence SQ1 including the thin film forming step and the cleaning step is about 45 [sec/time], the processing time for 20 times of the sequence SQ1 is 900 [sec] (=45 [sec/time]×20 [times]).

As represented in FIG. 21, as the number of times of repeating the thin film forming step increases, the above-described processing time TP1 and processing time TP2 become longer in comparison with the processing time TP3 according to the present embodiment, and the difference between the processing times TP1 and TP2 becomes remarkable.

A description will be made returning back to FIG. 1. In step ST7 subsequent to step ST6, the protective film SX is etched (etched back) so as to remove the regions R11 and the regions R21. Anisotropic etching conditions are required to remove the regions R11 and the regions R21. Therefore, in step ST7, a gas including a fluorocarbon-based gas is supplied from a gas source selected among the plurality of gas sources of the gas source group 40 into the processing space Sp of the processing container 12 through the gas supply pipe 38 and the gas inlet 36c.

Then, radio-frequency power is supplied from the first radio-frequency power supply 62. Radio-frequency bias power is supplied from the second radio-frequency power supply 64. By operating the exhaust device 50, the pressure in the processing space Sp of the processing container 12 is set to a preset pressure. As a result, plasma of fluorocarbon-based gas is generated.

Active species including fluorine in the generated plasma preferentially etches the regions R11 and the regions R21 by being drawn in the vertical direction by the radio-frequency bias power. As a result, as illustrated in FIG. 5A, the regions R11 and the regions R21 are selectively removed, and the mask MS is formed by the remaining regions R31. The mask MS, the protective film PF, and the mask ALM constitute a mask MK2 on the surface of the organic film OL.

In step ST8 subsequent to step ST7, the organic film OL is etched. Specifically, a gas including nitrogen gas and hydrogen gas is supplied from a gas source selected among the plurality of gas sources of the gas source group 40 into the processing space Sp of the processing container 12 through the gas supply pipe 38 and the gas inlet 36c.

Then, radio-frequency power is supplied from the first radio-frequency power supply 62. Radio-frequency bias power is supplied from the second radio-frequency power supply 64. By operating the exhaust device 50, the pressure in the processing space Sp of the processing container 12 is set to a preset pressure. As a result, plasma of a gas including nitrogen gas and hydrogen gas is generated.

Hydrogen radicals, which are the active species of hydrogen in the generated plasma, etch the regions exposed from the mask MK2 in the entire region of the organic film OL. As a result, as illustrated in FIG. 5B, a mask OLM is formed from the organic film OL. As the gas for etching the organic film OL, a gas including oxygen may be used.

In method MT illustrated in FIG. 1, following step ST8, sequence SQ2 is executed one or more times. As illustrated in FIGS. 5B and 5C, sequence SQ2 is a step of etching a region, not covered with the mask OLM, of the etching target layer EL, precisely with a high selectivity regardless of the roughness and fineness of the mask OLM by the same method as the ALE method, and includes step ST9a, step ST9b, step ST9c, and step ST9d which are sequentially executed in sequence SQ2.

In step ST9a, plasma of the gas G4 is generated in the processing space Sp of the processing container 12, and as illustrated in FIG. 5B, a mixed layer MX including radicals included in the plasma is formed in an atomic layer on the surface of the etching target layer EL. The mixed layer MX is formed in the atomic layer on the surface of a region, not covered with the mask OLM, of the etching target layer EL. In step ST9a, in the state where the wafer W is placed on the electrostatic chuck ESC, the gas G4 is supplied into the processing space Sp of the processing container 12 so as to generate the plasma of the gas G4.

The gas G4 is an etchant gas suitable for etching the etching target layer EL including silicon. The gas G4 may include, for example, a fluorocarbon-based gas and a rare gas, and may be, for example, a CxFy/Ar gas. CxFy may be, for example, $CF_4$. Specifically, from a gas source selected among the plurality of gas sources of the gas source group 40, the gas G4 including a fluorocarbon-based gas and a rare gas is supplied into the processing space Sp of the processing container 12 through the gas supply pipe 38 and the gas inlet 36c.

Then, by supplying radio-frequency power from the first radio-frequency power supply 62, supplying radio-frequency bias power from the second radio-frequency power supply 64, and operating the exhaust device 50, the pressure in the processing space Sp of the processing container 12 is set to a preset pressure. In this way, the plasma of the gas G4 is generated in the processing space Sp of the processing container 12. The plasma of gas G4 includes carbon radicals and fluorine radicals.

In FIGS. 9A to 9C, white unshaded circles (white circles) indicate atoms forming the etching target layer EL, shaded circles (black circles) indicate radicals, and circled "+" marks indicate ions of atoms of a rare gas (e.g., ions of Ar atoms) included in a gas G5 described below. As illustrated in FIG. 9A, in step ST9a, the carbon radicals and fluorine radicals included in the plasma of the gas G4 are supplied to the surface of the etching target layer EL.

In this way, a mixed layer MX including atoms forming the etching target layer EL, carbon radicals, and fluorine radicals is formed on the surface of the etching target layer EL, as illustrated in FIG. 5B.

As described above, since the gas G4 includes the fluorocarbon-based gas, in step ST9a, fluorine radicals and carbon radicals are supplied to the atomic layer on the surface of the etching target layer EL, and the mixed layer containing both the radicals may be formed in the atomic layer MX.

In step ST9b subsequent to step ST9a, the inside of the processing space Sp of the processing container 12 is purged. Specifically, the gas G4 supplied in step ST9a is exhausted. In step ST9b, an inert gas such as, for example, nitrogen gas or a rare gas (e.g., Ar gas) may be supplied into the processing container 12 as a purge gas. That is, the purge in step ST9b may be either gas purge that causes the inert gas to flow into the processing space Sp of the processing container 12, or purge that is performed in a vacuum state.

In step ST9c subsequent to step ST9b, plasma of the gas G5 is generated in the processing space Sp of the processing container 12, and a bias voltage is applied to the plasma so as to remove the mixed layer MX. The gas G5 may include a rare gas, for example, Ar gas.

Specifically, by supplying the gas G5 including a rare gas (e.g., Ar gas) into the processing space Sp of the processing container 12 through the gas supply pipe 38 and the gas inlet 36c from a gas source selected among the plurality of gas sources of the gas source group 40, supplying radio-frequency power from the first radio-frequency power supply 62, supplying radio-frequency bias power from the second radio-frequency power supply 64, and operating the exhaust device 50, the pressure in the processing space Sp of the processing container 12 is set to a preset pressure. In this way, the plasma of the gas G5 is generated in the processing space Sp of the processing container 12.

Ions of atoms of the gas G5 in the generated plasma (e.g., ions of Ar atoms) collide with the mixed layer MX on the surface of the etching target layer EL by being drawn in the vertical direction by the radio-frequency bias power so as to provide energy to the mixed layer MX. As illustrated in FIG. 9B, by step ST9c, energy is supplied to the mixed layer MX formed on the surface of the etching target layer EL via the ions of atoms of the gas G5, and the mixed layer MX is capable of being removed from the etching target layer EL by this energy.

As described above, since the gas G5 includes a rare gas, in step ST9c, the mixed layer MX formed on the surface of the etching target layer EL is capable of being removed from the surface by the energy received by the plasma of the rare gas by the bias voltage.

In step ST9d subsequent to step ST9c, the inside of the processing space Sp of the processing container 12 is purged. Specifically, the gas G5 supplied in step ST9c is exhausted. In step ST9d, an inert gas such as, for example, nitrogen gas or a rare gas (e.g., Ar gas) may be supplied into the processing container 12 as a purge gas. That is, the purge in step ST9d may be either gas purge that causes the inert gas to flow into the processing space Sp of the processing container 12, or purge that is performed in a vacuum state.

As illustrated in FIG. 9C, by the purge performed in step ST9d, atoms forming the mixed layer MX on the surface of the etching target layer EL and excess ions (e.g., ions of Ar atoms) included in the plasma of the gas G5 are also capable of being sufficiently removed.

In step ST10 subsequent to sequence SQ2, it is determined whether or not execution of sequence SQ2 is ended. Specifically, in step ST10, it is determined whether or not the number of times of execution of sequence SQ2 has reached a preset number of times. Determination of the number of times of execution of sequence SQ2 is to determine the degree (depth) of etching relative to the etching target layer EL.

Sequence SQ2 may be repeatedly executed so as to etch the etching target layer EL to the surface of the substrate SB. That is, the number of times of execution of sequence SQ2 may be determined such that the product of the thickness of the etching target layer EL to be etched by executing sequence SQ2 once (a unit cycle) and the number of times of execution of sequence SQ2 is the total thickness of the etching target layer EL itself. Therefore, the number of times of execution of sequence SQ2 may be set depending on the thickness of the etching target layer EL.

When it is determined in step ST10 that the number of times of execution of sequence SQ2 has not reached the preset number (step ST10: NO), execution of sequence SQ2 is repeated again. Meanwhile, when it is determined in step ST10 that the number of times of execution of sequence SQ2 has reached the preset number (step ST10: YES), execution of sequence SQ2 is ended, and the process proceeds to step ST7.

The thin film SXa formed inside the processing container 12 by the thin film forming step of sequence SQ1 (steps ST5a to ST5d) (more specifically, a portion, remaining after the cleaning by the cleaning step (steps ST5e and ST5f), of the thin film SXa formed inside the processing container 12 (the thin film SXa in the state represented by a state CON2 in FIG. 10)) is completely removed by the step including sequence SQ2 and step ST10 described above, as illustrated in a state CON1 in FIG. 10.

As described above, in the step including sequence SQ2 and step ST10, sequence SQ2 is repeatedly performed using the mask OLM in the same method as the ALE method so as to remove the etching target layer EL for each atomic layer, thereby precisely etching the etching target layer EL.

By executing the above-described method MT illustrated in FIG. 1, for example, the following effects can be exhibited. Since the cleaning step (step ST5e and step ST5f) is performed whenever a thin film is formed by executing the thin film forming step (step ST5a to step ST5d) once, it becomes easy to remove the corresponding thin film by the cleaning step for the region above the wafer W in the processing container 12 (the upper electrode 30 side region in the processing container 12).

In the thin film forming step, a reaction precursor (e.g., the layer Ly1 illustrated in FIG. 7B) is formed on the main surface of the wafer W by the gas G1, so that a thin film is capable of being conformally formed with respect to the reaction precursor by the gas G2. This thin film may also be formed in the processing container 12, but, with respect to a region above the wafer W in the processing container 12 (the upper electrode 30 side region in the processing container 12), the thin film is capable of being removed (cleaned) by the plasma of the gas G3 generated using the radio-frequency power supplied from the upper electrode 30 of the processing container 12.

Figure 22:
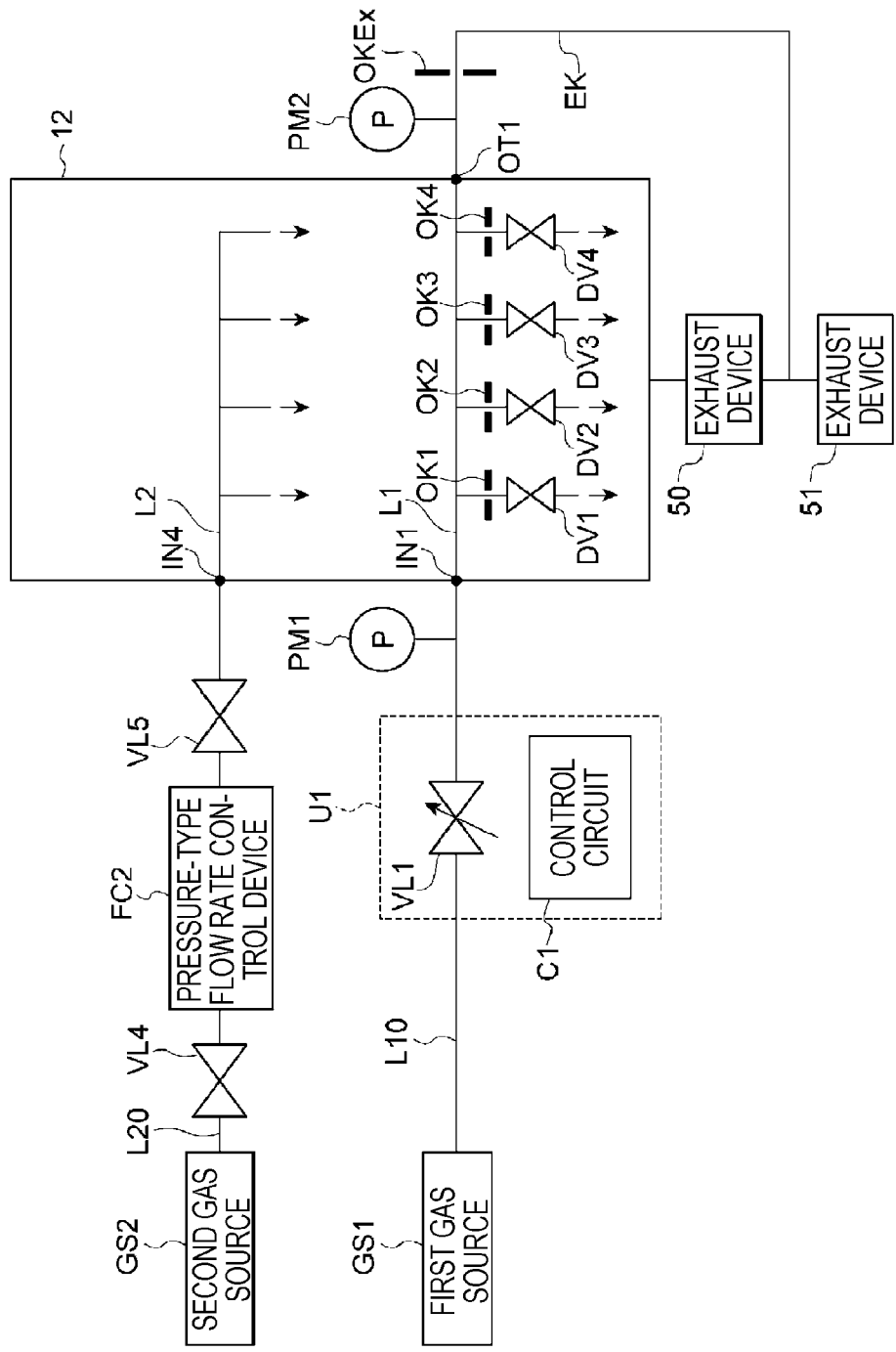
FIG. 22 is a schematic view of a gas supply system.

The configuration for supplying a gas is not limited to that illustrated in FIG. 2. That is, a gas supply system 1 illustrated in FIG. 22 may be used, rather than using the gas inlet 36c, the gas supply pipe 38, the gas source group 40, the valve group 42, the flow rate controller group 45, the gas inlet 52a, and the gas supply pipe 82 illustrated in FIG. 2. FIG. 22 is a schematic view of the gas supply system 1. The gas supply system 1 illustrated in FIG. 22 is an exemplary system that supplies a gas to the processing space Sp in the processing container 12 of the plasma processing apparatus 10. The gas supply system 1 illustrated in FIG. 22 includes a first flow path L1, a second flow path L2, a gas ejection hole 34a, a gas ejection hole 34b, a plurality of diaphragm valves (a diaphragm valve DV1, a diaphragm valve DV2, a diaphragm valve DV3, and a diaphragm valve DV4).

The first flow path L1 is connected to the first gas source GS1 of the first gas. The first flow path L1 is formed inside a ceiling member (e.g., the upper electrode 30) constituting the ceiling of the processing space Sp or inside the sidewall of the processing container 12. A plurality of gas ejection holes 34b make the first flow path L1 communicate with the processing space Sp. The second flow path L2 is connected to the second gas source GS2 of the second gas. The second flow path L2 is formed inside the ceiling member or inside the sidewall of the processing container 12. A plurality of gas ejection holes 34a make the second flow path L2 communicate with the processing space Sp. Each of the plurality of diaphragm valves (the diaphragm valves DV1 to DV4) is provided in correspondence with a gas ejection hole 34b between the first flow path L1 and the gas ejection hole 34b.

Figure 23:
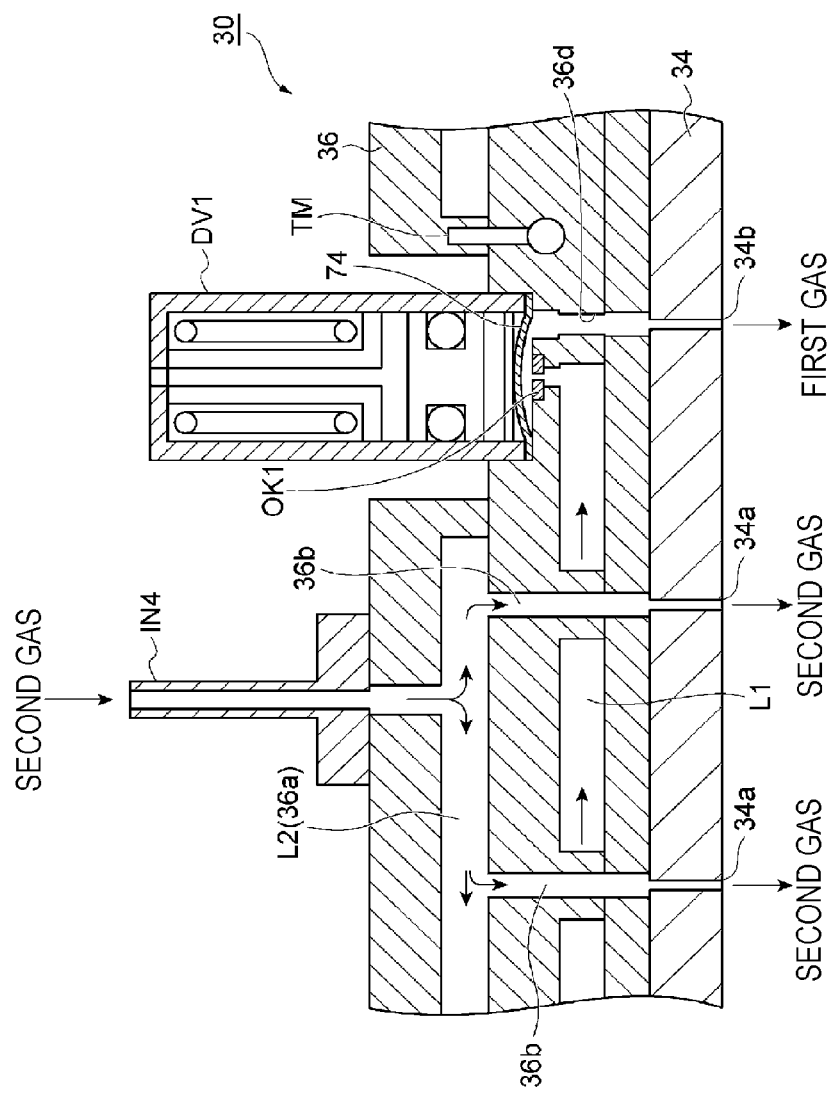
FIG. 23 is a schematic cross-sectional view of an upper electrode in a case where the gas supply system illustrated in FIG. 22.

The configuration of the gas supply system 1 will be described in more detail with reference to FIG. 23 together with FIG. 22. FIG. 23 is a schematic cross-sectional view of the upper electrode 30 when the gas supply system 1 illustrated in FIG. 22 is used. The gas supply system 1 includes the first gas source GS1 and the second gas source GS2. The first gas source GS1 stores the first gas. The second gas source GS2 stores the second gas. The first gas and the second gas are optional. As an example, the second gas may be a main process gas and the first gas may be an added process gas. In addition, the gas G1 may be a gas introduced into the processing space Sp from the gas inlet 52a, and the gas G2 may be a gas introduced into the processing space Sp from the gas inlet 36c.

The gas supply system 1 includes a main flow path L10 and a second main flow path L20. The first main flow path L10 connects the first gas source GS1 and the first flow path L1 of the processing container 12 to each other via a supply port IN1. The second main flow path L20 connects the second gas source GS2 and the second flow path L2 of the processing container 12 to each other via a supply port IN4. The first main flow path L10 and the second main flow path L20 are formed of, for example, a pipe. The second flow path L2 illustrated in FIGS. 22 and 23 corresponds to the gas diffusion chamber 36a illustrated in FIG. 1.

The first flow path L1 is connected to the first gas source GS1 and formed inside the upper electrode 30 (an exemplary ceiling member) of the processing container 12 or inside the sidewall of the processing container 12. The first flow path L1 has a supply port IN1 to which the first gas is supplied and an exhaust port OT1 through which the first gas is exhausted, and extends from the supply port IN1 to the exhaust port OT1. The exhaust port OT1 is connected to an exhaust device 51 configured to evacuate the processing container 12 via an exhaust flow path EK.

The first flow path L1 and the processing space Sp in the processing container 12 communicate with each other through the plurality of gas ejection holes 34b. The first gas is supplied to the processing space Sp of the processing container 12 from the plurality of gas ejection holes 34b connected to the first flow path L1.

Between the first flow path L1 and the gas ejection holes 34b, one diaphragm valve is provided so as to correspond to one gas ejection hole 34b. That is, the gas supply system 1 includes a plurality of diaphragm valves corresponding to the plurality of gas ejection holes 34b. As an example, in FIG. 22, four diaphragm valves (diaphragm valves DV1 to DV4) corresponding to four gas ejection holes 34b are illustrated. Each of the four diaphragm valves (e.g., the diaphragm valve DV1) is capable of operating independently.

An example of a diaphragm valve is an ON/OFF valve. The number of gas ejection holes 34b is not limited to four, but may be two or more. In addition, the plurality of diaphragm valves may be provided to correspond the plurality of gas ejection holes 34b, respectively, and the number of the diaphragm valves is not limited to four.

Between the first flow path L1 and the gas ejection holes 34b, one orifice may be provided so as to correspond to one gas ejection hole 34b. The orifice is arranged on the upstream side of the diaphragm valve. As an example, FIG. 22 illustrates four orifices (orifices OK1 to OK4). Each diaphragm valve controls the supply timing of the first gas supplied from the outlet of an orifice to a gas ejection hole 34b. The plurality of orifices may be provided to correspond to the plurality of gas ejection holes 34b, respectively, and the number of orifices is not limited to four.

The first second path L2 is connected to the second gas source GS2, and formed inside the upper electrode 30 of the processing container 12 or inside the sidewall of the processing container 12. The second flow path L2 is connected to the plurality of gas ejection holes 34a. The second gas is supplied to the processing space Sp of the processing container 12 from the plurality of gas ejection holes 34b each of which is connected to the first flow path L2.

The gas supply system 1 may include a pressure-type flow rate control device FC. The pressure-type flow rate control device FC is disposed on the downstream side of the second gas source GS2 in the second main flow path L20. A primary valve VL4 is provided on the upstream side of the pressure-type flow control device FC and a secondary valve VL5 is provided on the downstream side of the pressure-type flow control device FC.

In addition, the flow rate control device is not limited to the pressure-type flow rate control device and may be a thermal flow rate control device or a flow rate control device based on other principles.

The second gas of the second gas source GS2 is adjusted in flow rate and pressure by the pressure-type flow rate control device FC and supplied to the second flow path L2 of the processing container 12 through the supply port IN4.

The gas supply system 1 may include a control valve VL1. The control valve VL1 is disposed on the downstream side of the first gas source GS1 in the first main flow path L10. The control valve VL1 is provided upstream of the supply port IN1, and controls the first gas supplied to the supply port IN1 to a preset pressure.

The control valve VL1 has the same function as the control valve of the pressure-type flow rate control device FC. A first pressure detector PM1 may be disposed in the flow path between the control valve VL1 and the supply port IN1.

As an example, the control valve VL1 controls the flow rate of the first gas based on the detection result of the first pressure detector PM1. As a more specific example, a control circuit C1 determines the operation of the control valve VL1.

The control circuit C1 inputs the pressure detected by the first pressure detector PM1 and calculates the flow rate of the detected pressure. Then, the control circuit C1 compares the set target flow rate with the calculated flow rate, and determines the operation of the control valve VL1 such that the difference therebetween becomes small.

In addition, a primary valve may be provided between the first gas source GS1 and the control valve VL1. A secondary valve may be provided downstream of the control valve VL1 and upstream of the first pressure detector PM1. Further, the control circuit C1 and the control valve VL1 may be unitized as a unit U1.

The gas supply system 1 may further include a second pressure detector PM2 configured to detect the pressure of the first gas exhausted from the exhaust port OT1. In this case, the control valve VL1 controls the flow rate of the first gas, for example, based on the detection results of the first pressure detector PM1 and the second pressure detector PM2.

More specifically, the pressure of the first gas at each orifice arrangement position is calculated based on the detection result of the first pressure detector PM1 and the detection result of the second pressure detector PM2. Then, based on the pressure calculation result, the supply timing of the first gas by each diaphragm valve is controlled.

The gas supply system 1 may include a temperature detector TM (see, e.g., FIG. 23) configured to detect the temperature of the first gas in the first flow path L1. In this case, similarly to the control valve provided in the pressure-type flow rate control device FC, the control valve VL1 performs flow rate correction using the temperature detector TM. Specifically, the control valve VL1 controls the flow rate of the first gas based on the detection result of the temperature detector TM.

The first gas of the first gas source GS1 is adjusted in flow rate and pressure by the control valve VL1 and supplied to the first flow path L1 of the processing container 12 through the supply port IN1. In addition, the exhaust port OT1 of the first flow path L1 may be provided with an exhaust orifice OKEx.

The control unit Cnt of the plasma processing apparatus 10 operates the control valve VL1 and the plurality of diaphragm valves (e.g., the diaphragm valves DV1 to DV4) in the gas supply system 1.

In the gas supply system 1, the controller Cnt inputs a recipe stored in the storage unit and outputs a signal to the control circuit C1 that operates the control valve VL1. In the gas supply system 1, the controller Cnt inputs the recipe stored in the storage unit and controls the opening and closing operations of the plurality of diaphragm valves (e.g., the diaphragm valves DV1 to DV4). In the gas supply system 1, the controller Cnt may operate the exhaust device 51 via the control circuit C1. In addition, in the storage unit of the controller Cnt, a computer program for executing method MT and various data used for executing method MT (e.g., corresponding data DT) are readably stored.

An exhaust device 50 and an exhaust device 51 are connected to the exhaust port 12e via an exhaust pipe 52. The exhaust device 50 is a turbo molecular pump, and the exhaust device 51 is a dry pump. The exhaust device 50 is provided on the upstream side of the exhaust device 51 with respect to the processing container 12.

The exhaust flow path EK of the gas supply system 1 is connected to the pipe between the exhaust device 50 and the exhaust device 51. By connecting the exhaust flow path EK between the exhaust device 50 and the exhaust device 51, backflow of the gas from the exhaust flow path EK into the processing container 12 is suppressed.

As illustrated in FIG. 23, the first flow path L1 and the second flow path L2 extending in the horizontal direction are provided inside the electrode support 36 of the upper electrode 30. The first flow path L1 is positioned below the second flow path L2.

The electrode support 36 is provided with a plurality of gas flow holes 36d that connect the first flow path L1 and the plurality of gas ejection holes 34b extending below the first flow path L1. An orifice OK1 and a diaphragm valve DV1 are provided between the first flow path L1 of the electrode support 36 and the gas ejection holes 34b. A sealing member 74 that exerts a valve function is disposed below the diaphragm valve DV1.

The sealing member 74 may be formed of a flexible member. The sealing member 74 may be, for example, an elastic member, a diaphragm, or a bellows.

When the diaphragm valve DV1 is opened, the first gas flowing through the first flow path L1 passes through the outlet of the orifice OK1, the gas flow holes 36d, and the gas ejection holes 34b so as to be supplied to the processing space Sp. Other gas ejection holes 34b also have the same configuration. In addition, the electrode support 36 is provided with a temperature detector TM so as allow the control valve VL1 to perform flow rate correction.

The electrode support 36 is provided with a plurality of gas flow holes 36b that connect the second flow path L2 and the plurality of gas ejection holes 34a extending below the second flow path L2. The second gas is supplied through the supply port IN4, and is supplied to the processing space Sp through the plurality of gas flow holes 36b and the plurality of gas ejection holes 34a.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming method comprising:
placing a substrate having a pattern on a pedestal provided in a space of a processing container configured to perform therein a plasma processing under a reduced pressure environment, the processing container including an upper electrode configured to supply radio-frequency power and being disposed in the space to face the pedestal;
adjusting temperature of a main surface of the substrate for each of a plurality of regions on the main surface of the substrate; and
after the adjusting, repeating a sequence including a first step, a second step and a third step in this order while the substrate is placed on the pedestal,
the first step comprising supplying a first gas including a material of a precursor to the space so as to cause the precursor to be adsorbed onto a surface of the pattern;
the second step comprising generating plasma from a second gas and supplying the plasma to the precursor to form the deposition film on the pattern of the substrate and on an inner surface of the processing container, wherein the inner surface on which the deposition film is formed includes the upper electrode; and
the third step comprising supplying electric power only to the upper electrode to generate plasma in the space and cleaning the inner surface, the cleaning including removing the deposition film formed on the inner surface of the processing container.

2. The film forming method of claim 1, wherein, in the adjusting, the temperature of the main surface is adjusted for each of the plurality of regions using previously acquired corresponding data indicating correspondence between the temperature of the main surface and a film thickness of the deposited film.

3. The film forming method of claim 1, wherein the first gas is an aminosilane-based gas.

4. The film forming method of claim 1, wherein the second gas contains oxygen or nitrogen.

5. The film forming method of claim 1, wherein, in the third step, plasma of a third gas is generated in the space, and the third gas contains a halogen compound.

6. The film forming method of claim 1, wherein the aminosilane-based gas of the first gas includes aminosilane having 1 to 3 silicon atoms.

7. The film forming method of claim 1, wherein the aminosilane-based gas of the first gas includes aminosilane having 1 to 3 amino groups.

8. The film forming method of claim 1, wherein the first gas contains a tungsten halide.

9. The film forming method of claim 1, wherein the first gas contains titanium tetrachloride or tetrakis(dimethylamino)titanium.

10. The film forming method of claim 1, wherein the first gas contains a boron halide.

11. The film forming method of claim 1, wherein, in the first step, the deposited film is formed by a polymerization reaction of an isocyanate and an amine or a polymerization reaction of an isocyanate and a compound having a hydroxyl group.

12. The film forming method of claim 1, wherein the third step is performed in a wide gap condition where the electrode interval is set to 30 mm or more.

13. The film forming method of claim 1, wherein the third step includes a condition in which pressure in the space of the processing container is set to 100 mTorr or higher.

14. The film forming method of claim 1, wherein the supplying the plasma to the precursor is performed in a state where a bias power is not applied.

15. A substrate processing method comprising:
providing a substrate having a plurality of regions, the substrate including an etching target layer and a mask provided on the etching target layer on a main surface thereof, the mask having a pattern;
placing the substrate on a pedestal provided in a space of a plasma processing apparatus including an upper electrode disposed in the space to face the pedestal;
adjusting temperature of the substrate for each of the plurality of regions;
after the adjusting, repeating a sequence including a first step, a second step and a third step in this order while the substrate is on the pedestal;
the first step comprising supplying a first gas including a material of a precursor to the space so as to cause the precursor to be adsorbed onto a surface of the pattern;
the second step comprising generating plasma from a second gas and supplying the plasma to the precursor to form the deposition film on the pattern of the substrate, and during forming of the deposition film on the pattern of the substrate the deposition film is formed on an inner surface of the processing apparatus, wherein the inner surface on which the deposition film is formed includes at least the upper electrode;
the third step comprising supplying electric power only to the upper electrode to generate plasma in the space and cleaning the inner surface of the processing apparatus; and
after the first to third steps, etching the etching target layer.

16. The substrate processing method of claim 15, wherein the etching the etching target layer includes:
forming a mixed layer including plasma radicals on the surface of the etching target layer by: (a) plasma which includes carbon radicals and fluorine radicals, or (b) plasma generated from a processing gas containing a fluorocarbon; and
removing the mixed layer by plasma generated from a processing gas containing a rare gas.

17. The substrate processing method of claim 15, wherein the adjusting of the temperature includes adjusting the temperature of a main surface of the substrate.

18. The substrate processing method of claim 15, wherein the substrate includes a mask to provide the pattern.

19. A film forming method comprising:
placing a substrate having a pattern on a pedestal provided in a space of a processing container configured to perform therein a plasma processing under a reduced pressure environment, the processing container including an upper electrode configured to supply radio-frequency power and being disposed in the space to face the pedestal;

adjusting temperature of a main surface of the substrate for each of a plurality of regions on the main surface of the substrate; and after the adjusting, repeating a sequence including a first step, a second step and a third step in this order while the substrate is placed on the pedestal, the first step comprising supplying a first gas containing an electron-donating first substituent to the space and causing the first substituent to be adsorbed onto a surface of the pattern; and the second step comprising supplying a second gas containing an electron-attracting second substituent to the first substituent to form the deposition film on the pattern of the substrate and on an inner surface of the processing container, wherein the inner surface on which the deposition film is formed includes the upper electrode; and the third step comprising supplying electric power only to the upper electrode to generate plasma in the space and cleaning the inner surface, the cleaning including removing the deposition film formed on the inner surface of the processing container.

* * * * *